US012453263B2

(12) United States Patent
Choi et al.

(10) Patent No.: US 12,453,263 B2
(45) Date of Patent: Oct. 21, 2025

(54) DISPLAY APPARATUS AND METHOD OF PROVIDING DISPLAY APPARATUS

(71) Applicant: Samsung Display Co., Ltd., Yongin-si (KR)

(72) Inventors: Jongbum Choi, Yongin-si (KR); Seulki Kim, Yongin-si (KR); Kapsoo Yoon, Yongin-si (KR); Woogeun Lee, Yongin-si (KR); Jaehyun Lee, Yongin-si (KR); Seungha Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 654 days.

(21) Appl. No.: 17/835,415

(22) Filed: Jun. 8, 2022

(65) Prior Publication Data

US 2023/0131708 A1    Apr. 27, 2023

(30) Foreign Application Priority Data

Oct. 21, 2021  (KR) .................. 10-2021-0141363

(51) Int. Cl.
| | |
|---|---|
| *H10K 59/131* | (2023.01) |
| *H10K 71/00* | (2023.01) |
| *G09G 3/3233* | (2016.01) |
| *H10K 59/12* | (2023.01) |

(52) U.S. Cl.
CPC ......... *H10K 59/1315* (2023.02); *H10K 71/00* (2023.02); *G09G 3/3233* (2013.01); *G09G 2300/0426* (2013.01); *G09G 2300/0842* (2013.01); *H10K 59/1201* (2023.02)

(58) Field of Classification Search
CPC . H10K 59/1315; H10K 59/1201; H10K 71/00
See application file for complete search history.

(56) References Cited

U.S. PATENT DOCUMENTS

| | | | |
|---|---|---|---|
| 9,029,850 | B2 | 5/2015 | Lee et al. |
| 2014/0291636 | A1 | 10/2014 | Kim et al. |
| 2016/0087021 | A1 | 3/2016 | Sato |

(Continued)

FOREIGN PATENT DOCUMENTS

| | | |
|---|---|---|
| KR | 101920770 B1 | 11/2018 |
| KR | 10-2081289 B1 | 2/2020 |
| KR | 1020200026569 A | 3/2020 |

*Primary Examiner* — Nathan W Ha
(74) *Attorney, Agent, or Firm* — CANTOR COLBURN LLP

(57) ABSTRACT

A display apparatus includes a substrate, a semiconductor layer on the substrate, the semiconductor layer including an oxide semiconductor, a channel region and a first region which extends from the channel region to a first edge of the semiconductor layer and has a lower resistance than that of the channel region, a first inorganic insulating layer covering the semiconductor layer and including a first contact hole which overlaps the first region, a first electrode on the first inorganic insulating layer, overlapping the first region and electrically connected to the first region through the first contact hole, a gate electrode on the first inorganic insulating layer and overlapping the channel region, a second inorganic insulating layer covering the first electrode and the gate electrode, and a display element on the second inorganic insulating layer.

20 Claims, 31 Drawing Sheets

(56) References Cited

U.S. PATENT DOCUMENTS

| | | |
|---|---|---|
| 2017/0294464 A1 | 10/2017 | Kwon |
| 2017/0294498 A1* | 10/2017 | Kwon ................ H10K 59/1213 |
| 2019/0164999 A1 | 5/2019 | Choi et al. |
| 2019/0172884 A1 | 6/2019 | Shim et al. |
| 2019/0181207 A1 | 6/2019 | Kim |
| 2020/0083308 A1* | 3/2020 | Kwon .................... H10K 71/00 |
| 2020/0091264 A1 | 3/2020 | Lee et al. |
| 2021/0091163 A1 | 3/2021 | Son et al. |
| 2023/0015542 A1* | 1/2023 | Liu ..................... H01L 27/1225 |
| 2023/0123185 A1* | 4/2023 | Kim ..................... H10K 59/124 257/40 |
| 2023/0143126 A1* | 5/2023 | Yeon ................... H10K 59/126 257/40 |
| 2023/0155031 A1* | 5/2023 | Ding ................. H10D 30/6757 257/288 |

\* cited by examiner

DISPLAY APPARATUS AND METHOD OF PROVIDING DISPLAY APPARATUS

This application claims priority to Korean Patent Application No. 10-2021-0141363, filed on Oct. 21, 2021, and all the benefits accruing therefrom under 35 U.S.C. § 119, the disclosure of which is incorporated by reference herein in its entirety.

BACKGROUND

1. Field

One or more embodiments relate to a display apparatus and a method of manufacturing (or providing) a display apparatus.

2. Description of the Related Art

A display apparatus visually displays data. A display apparatus may be used as a display of a small-sized product such as a mobile phone, or a display of a large-sized product such as a television.

A display apparatus may include a liquid crystal display apparatus that does not directly emit light but instead uses light from a backlight unit, or may include a light-emitting display apparatus including a display element that may self-emit light and include an emission layer for self-emitting the light. The display apparatus may include alternately stacked layers among conductive layers and insulating layers.

SUMMARY

One or more embodiments include a display apparatus having a relatively simple stacked structure, while simultaneously having increased reliability, and a method of manufacturing (or providing) a display apparatus.

Additional aspects will be set forth in part in the description which follows and, in part, will be apparent from the description, or may be learned by practice of the presented embodiments of the disclosure.

According to one or more embodiments, a display apparatus includes a substrate, a semiconductor layer on the substrate, the semiconductor layer including an oxide semiconductor, a channel region and a first region which extends from the channel region to a first edge of the semiconductor layer and has a lower resistance than that of the channel region, a first inorganic insulating layer covering the semiconductor layer and including a first contact hole which overlaps the first region, a first electrode on the first inorganic insulating layer, overlapping the first region and electrically connected to the first region through the first contact hole, a gate electrode on the first inorganic insulating layer and overlapping the channel region, a second inorganic insulating layer covering the first electrode and the gate electrode, and a display element on the second inorganic insulating layer.

The first electrode may overlap an entirety of the first contact hole.

The first electrode may include a same material as that of the gate electrode.

The display apparatus may further include a second electrode between the first inorganic insulating layer and the second inorganic insulating layer, the semiconductor layer may further include a second region extending from the channel region to a second edge of the semiconductor layer, having a lower resistance than that of the channel region and overlapping the second electrode, the first inorganic insulating layer may further include a second contact hole overlapping the second region and electrically connecting the second region to the second electrode, the second inorganic insulating layer may include a lower hole exposing one of the first electrode and the second electrode, and one of the first electrode and the second electrode may be electrically connected to the display element through the lower hole.

The first inorganic insulating layer may continuously extend from the contact hole to the second contact hole and overlap the first region, the channel region and the second region.

The display apparatus may further include a buffer layer between the substrate and the semiconductor layer, and a wiring between the substrate and the buffer layer, the wiring may be electrically connected to the first electrode through a hole of the buffer layer and a hole of the first inorganic insulating layer.

The display apparatus may further include a first capacitor electrode between the substrate and the buffer layer, and a second capacitor electrode between the buffer layer and the first inorganic insulating layer and overlapping the first capacitor electrode, and the second capacitor electrode may include an oxide semiconductor and have a lower resistance than that of the channel region.

The display apparatus may further include a third capacitor electrode between the first inorganic insulating layer and the second inorganic insulating layer and overlapping the second capacitor electrode, and the third capacitor electrode may be electrically connected to the first capacitor electrode.

The display apparatus may further include a fourth capacitor electrode on the second inorganic insulating layer and overlapping the second capacitor electrode, the display element may include a pixel electrode, an emission layer and an opposite electrode, and the pixel electrode may include a same material as that of the fourth capacitor electrode.

The display apparatus may further include a color panel on the display element and changing a wavelength of light emitted from the display element.

According to one or more embodiments, a method of manufacturing (or providing) a display apparatus includes forming (or providing) a semiconductor layer on a substrate, the semiconductor layer including an oxide semiconductor, a channel region and a first region, where the first region has a lower resistance than that of the channel region, forming a first inorganic insulating layer covering the first region and the channel region, forming a first contact hole in the first inorganic insulating layer which overlaps the first region, forming a first electrode and a gate electrode, where the first electrode overlaps the first region and is electrically connected to the first region through the first contact hole, and the gate electrode overlaps the channel region, and forming a second inorganic insulating layer covering the first electrode and the gate electrode.

The forming of the semiconductor layer may include forming a first layer including an oxide semiconductor, forming a photoresist on the first layer which includes a first photoresist region having a first thickness and a channel photoresist region having a second thickness, etching the first layer, and stripping the photoresist, where the second thickness may be greater than the first thickness.

The forming of the semiconductor layer may further include etching the photoresist, where, when the photoresist is etched, the first region may be exposed and doped.

The first region may extend from the channel region to a first edge of the semiconductor layer.

The method may further include, before the forming of the semiconductor layer, forming a first capacitor electrode and a buffer layer on the substrate, the buffer layer covering the first capacitor electrode. The forming of the semiconductor layer may include forming a second capacitor electrode which includes an oxide semiconductor, has a lower resistance than that of the channel region and overlaps the first capacitor electrode.

The forming of the semiconductor layer may include forming a first layer including an oxide semiconductor, forming a capacitor photoresist on the first layer, etching the first layer, and etching the capacitor photoresist. When the capacitor photoresist is etched, the second capacitor electrode may be exposed and doped.

The semiconductor layer may further include a second region extending from the channel region to a second edge of the semiconductor layer and doped with impurities, the forming of the first contact hole may include forming a second contact hole overlapping the second region, and the first inorganic insulating layer may continuously extend from the first contact hole to the second contact hole, and overlap the first region, the channel region and the second region.

The method may further include forming an organic insulating layer on the second inorganic insulating layer, forming an organic insulating layer hole by exposing and developing at least a portion of the organic insulating layer, and forming a lower hole by etching the second inorganic insulating layer, the lower hole overlapping the organic insulating layer hole.

The organic insulating layer hole and the lower hole may each be formed by using a same mask.

The method may further include forming a pixel electrode overlapping the organic insulating layer hole, and forming a pixel-defining layer including a pixel opening and covering edges of a pixel electrode, where the pixel opening may overlap the pixel electrode.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
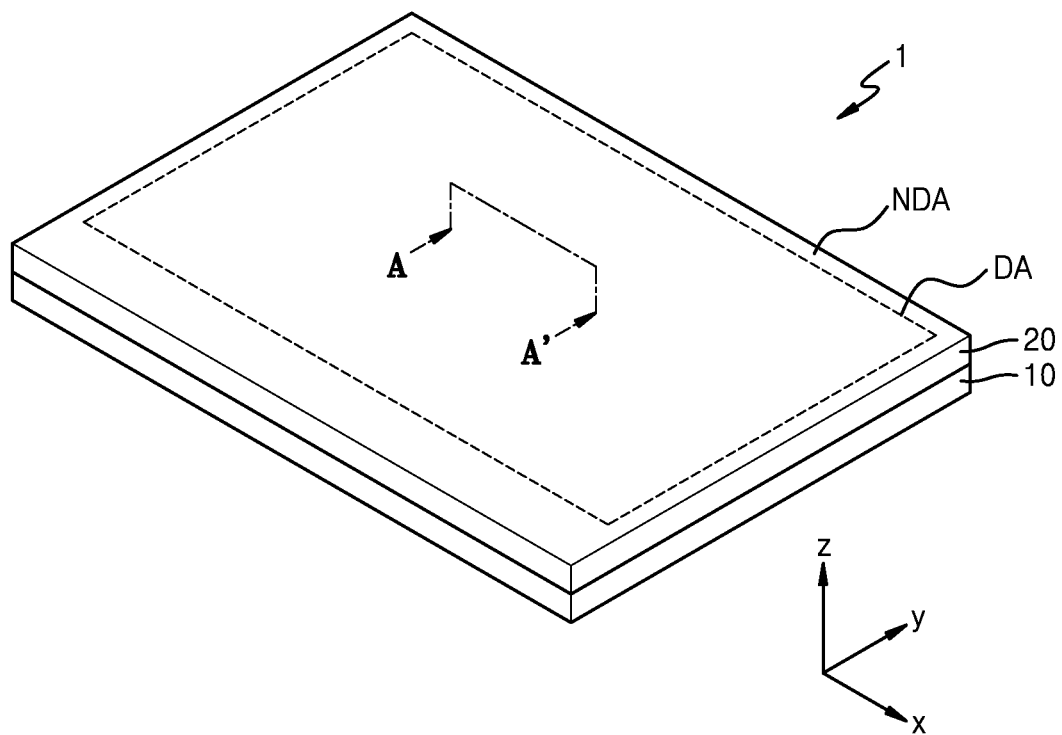
FIG. 1 is a schematic perspective view of a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The terminology used herein is for the purpose of describing particular embodiments only and is not intended to be limiting. The singular forms "a," "an," and "the" as used herein are intended to include the plural forms as well unless the context clearly indicates otherwise. For example, "an element" has the same meaning as "at least one element," unless the context clearly indicates otherwise. "At least one" is not to be construed as limiting "a" or "an." "Or" means "and/or."

It will be understood that the terms "comprise," "comprising," "include" and/or "including" as used herein specify the presence of stated features or components but do not preclude the addition of one or more other features or components.

It will be further understood that, when a layer, region, or component is referred to as being related to another element such as being "on" another layer, region, or component, it can be directly or indirectly on the other layer, region, or component. That is, for example, intervening layers, regions, or components may be present. In contrast, when a layer, region, or component is referred to as being related to another element such as being "directly on" another layer, region, or component, no intervening layers, regions, or components are present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

In the case where an embodiment may be implemented differently, a process order may be performed in the order different from the described order. As an example, two processes that are successively described may be substantially simultaneously performed or performed in the order opposite to the order described.

It will be understood that when a layer, region, or component is referred to as being related to another element such as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2A:
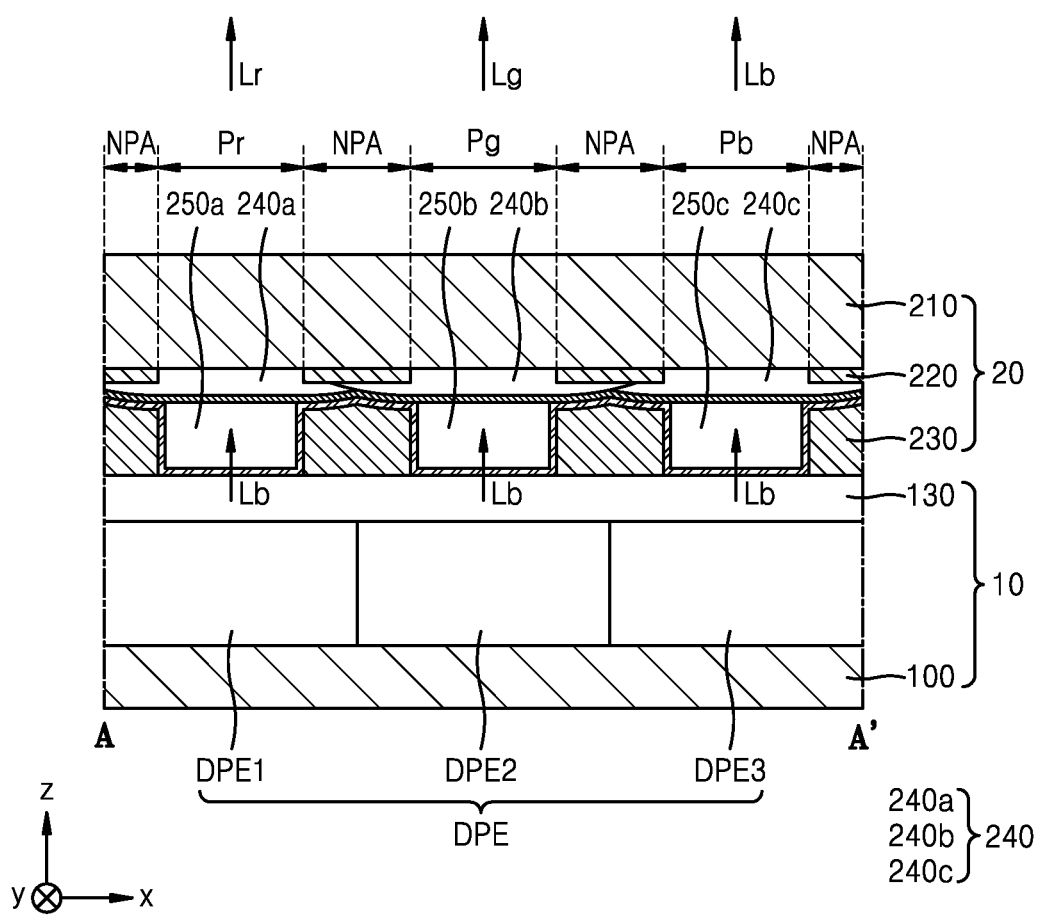
FIG. 2A is a cross-sectional view of the display apparatus, taken along a line A-A' of FIG. 1.
Figure 2B:
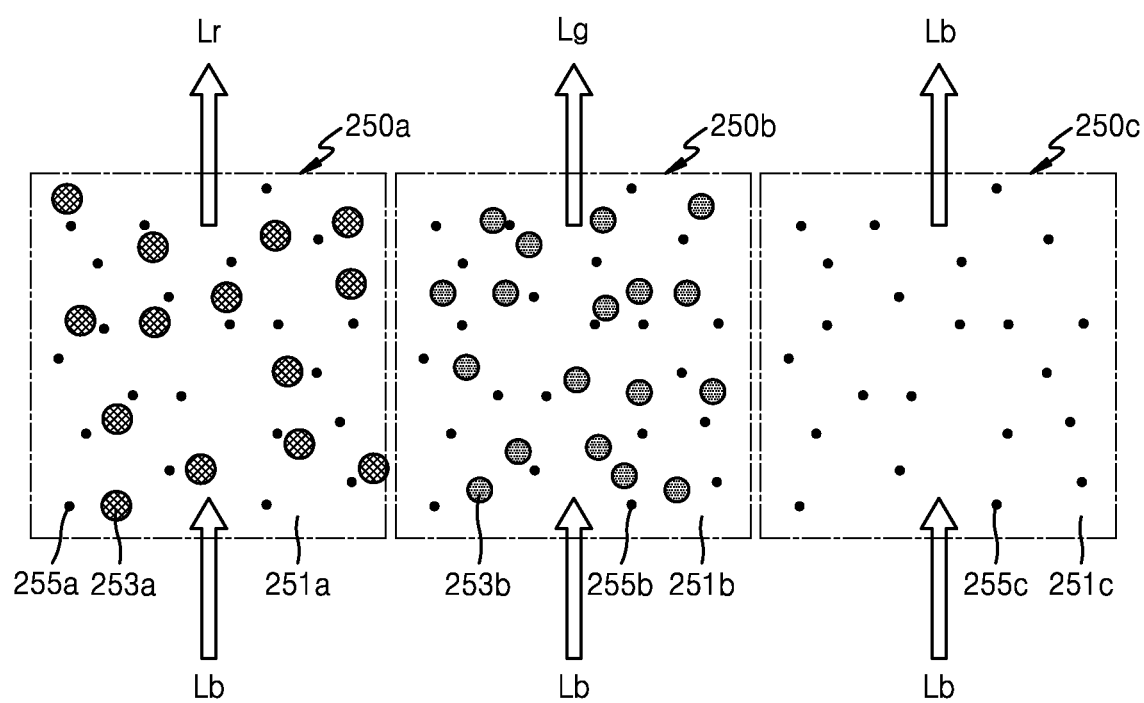
FIG. 2B is a view of a first color-converting layer, a second color-converting layer, and a transmission layer of FIG. 2A.

FIG. 1 is a schematic perspective view of a display apparatus 1 according to an embodiment. FIG. 2A is a cross-sectional view of the display apparatus 1, taken along a line A-A' of FIG. 1. FIG. 2B is a view of a first color-converting layer, a second color-converting layer, and a transmission layer of FIG. 2A.

Referring to FIG. 1, the display apparatus 1 may display images. The display apparatus 1 may include a display area DA and a non-display area NDA. The display apparatus 1 may display images by using a plurality of sub-pixels arranged in the display area DA. Each sub-pixel of the display apparatus 1 is a region that may emit light of a color, and the display apparatus 1 may display images by using light emitted from the plurality of sub-pixels. As an example, a sub-pixel may emit red, green, or blue light. As another example, the sub-pixel may emit, red, green, blue, or white light.

The non-display area NDA may be adjacent to the display area DA, and may at least partially surround the display area DA. In an embodiment, the non-display area NDA may surround the display area DA entirely. The non-display area NDA may be a region that does not display images. Various layers and components of the display apparatus 1 may include a display area DA and a non-display area corresponding to those described for the display apparatus 1.

As shown in FIG. 1, the display area DA may have a polygonal shape including a quadrangular shape. As an example, the display area DA may have a rectangular shape in which a horizontal length is greater than a vertical length, a rectangular shape in which a horizontal length is less than a vertical length, or a square shape. Alternatively, the display area DA may have various planar shapes such as ellipses or circles. In an embodiment, the display apparatus 1 may include a light-emitting panel 10 and a color panel 20 that are stacked in a thickness direction (e.g., a z direction), such as to form a stacked structure.

Referring to FIGS. 2A and 2B, the light-emitting panel 10 may include a display element DPE arranged on a substrate 100. In an embodiment, the display element DPE may be provided in plural including a plurality of display elements DPE. The plurality of display elements DPE may include a first display element DPE1, a second display element DPE2, and a third display element DPE3. Though not shown in FIG. 2A, the first display element DPE1, the second display element DPE2, and the third display element DPE3 may each be electrically connected to a pixel circuit PC and driven by the pixel circuit PC.

The first display element DPE1, the second display element DPE2, and the third display element DPE3 may each emit light. In an embodiment, the first display element DPE1, the second display element DPE2, and the third display element DPE3 may emit a same light. As an example, the first display element DPE1, the second display element DPE2, and the third display element DPE3 may emit one of red light Lr, green light Lg, and blue light Lb. As another example, the first display element DPE1, the second display element DPE2, and the third display element DPE3 may emit one of red light Lr, green light Lg, blue light Lb, and white light. In another embodiment, one of the first display element DPE1, the second display element DPE2, and the third display element DPE3 and another of the first display element DPE1, the second display element DPE2, and the third display element DPE3 may emit different light from each other. As an example, the first display element DPE1 may emit red light Lr, the second display element DPE2 may emit green light Lg, and the third display element DPE3 may emit blue light Lb. As another example, the first display element DPE1 may emit red light Lr, the second display element DPE2 may emit green light Lg, the third display element DPE3 may emit blue light Lb, and a fourth display element may emit white light. Hereinafter, the case where all of the first display element DPE1, the second display element DPE2, and the third display element DPE3 emit blue light Lb is mainly described in detail. The first display element DPE1, the second display element DPE2, and the third display element DPE3 may covered by an encapsulation layer 130.

The color panel 20 may be arranged on the light-emitting panel 10 to face the light-emitting panel 10. The color panel 20 may change the wavelength of light emitted from the light-emitting panel 10 (e.g., wavelength convert light). In an embodiment, the color panel 20 may be arranged on the display element DPE. The color panel 20 may change the wavelength of light emitted from the display element DPE. In an embodiment, blue light Lb emitted from the first display element DPE1, the second display element DPE2, and the third display element DPE3 may be converted to red light Lr, green light Lg, and blue light Lb, or may be transmitted (without wavelength-conversion), while passing through the color panel 20. A region of the display apparatus 1 from which red light Lr is emitted may correspond to a red sub-pixel Pr. A region from which green light Lg is emitted may correspond to a green sub-pixel Pg. A region through which blue light Lb is transmitted may correspond to a blue sub-pixel Pb.

The color panel 20 may include an upper substrate 210, a first light-blocking layer 220, a second light-blocking layer 230, a color filter 240 (e.g., color filter layer), a first color converter 250a, a second color converter 250b, and a transmission part 250c (e.g., transmitter). The first light-blocking layer 220 may include (or define) a plurality of holes formed when solid portions corresponding to the red sub-pixel Pr, the green sub-pixel Pg, and the blue sub-pixel Pb of a light-blocking material layer are removed. The first light-blocking layer 220 may include a material portion (e.g., solid portion) overlapping a non-pixel area NPA, and the material portion may include various materials that may absorb light. The solid portions may define first light-blocking patterns within the first light-blocking layer 220.

The second light-blocking layer 230 may be arranged on the first light-blocking layer 220. The second light-blocking layer 230 may include a material portion overlapping the non-pixel area NPA and the first light-blocking patterns, and the material portion may include various materials that may absorb light. The solid portions may define second light-blocking patterns within the second light-blocking layer 230. The second light-blocking layer 230 may include a material that is the same as or different from that of the first light-blocking layer 220. In an embodiment, the first light-blocking layer 220 and/or the second light-blocking layer 230 may include an opaque inorganic insulating material such as chrome oxide or molybdenum oxide or include an opaque organic insulating material such as a black resin.

The color filter 240 may include a first color filter 240a, a second color filter 240b, and a third color filter 240c. The first color filter 240a may include pigment or dye of a first color (e.g., red). The second color filter 240b may include pigment or dye of a second color (e.g., green). The third color filter 240c may include pigment or dye of a third color (e.g., blue). In an embodiment, the first light-blocking layer 220 may be omitted, and a light-blocking member may be arranged in the non-pixel area NPA, the light-blocking member including the first color filter 240a, the second color filter 240b, and the third color filter 240c that are stacked on each other.

The first color converter 250a, the second color converter 250b, and the transmission part 250c may be arranged between the color filter 240 and the display element DPE.

The first color converter 250a may overlap the first color filter 240a and convert blue light Lb incident thereto, to red light Lr. The first color converter 250a may include a first photosensitive polymer 251a, first quantum dots 253a, and first scattering particles 255a. The first quantum dots 253a and the first scattering particles 255a may be dispersed in the first photosensitive polymer 251a.

The first quantum dots 253a may be excited by blue light Lb and may emit red light Lr having a greater wavelength than the wavelength of the blue light Lb. The first photosensitive polymer 251a may be an organic material having light transmittance. The first scattering particles 255a may increase a color-converting efficiency by scattering blue light Lb not absorbed in the first quantum dots 253a and allowing more first quantum dots 253a to be excited. The first scattering particles 255a may be, for example, titanium oxide $TiO_2$, metal particles, or the like. The first quantum dots 253a may be one of a Group II-Group VI compound, a Group III-Group V compound, a Group IV-Group VI compound, a Group IV element, a Group IV compound, and a combination thereof.

The second color converter 250b may overlap the second color filter 240b and convert blue light Lb incident thereto to green light Lg. The second color converter 250b may include a second photosensitive polymer 251b, second quantum dots 253b, and second scattering particles 255b. The second quantum dots 253b and the second scattering particles 255b may be dispersed in the second photosensitive polymer 251b.

The second quantum dots 253b may be excited by blue light Lb and may emit green light Lg having a greater wavelength than the wavelength of the blue light Lb. The second photosensitive polymer 251b may be an organic material having light transmittance. The second scattering particles 255b may increase a color-converting efficiency by scattering blue light Lb not absorbed in the second quantum dots 253b and allowing more second quantum dots 253b to be excited. The second scattering particles 255b may be, for example, titanium oxide $TiO_2$, metal particles, or the like. The second quantum dots 253b may be one of a Group II-Group VI compound, a Group III-Group V compound, a Group IV-Group VI compound, a Group IV element, a Group IV compound, and a combination thereof. The size of the quantum dot may be several nanometers, and the wavelength of light after conversion may be changed depending on the size of the quantum dot.

Blue light Lb may pass through the transmission part 250c as a light transmission pattern. The transmission part 250c may include a third photosensitive polymer 251c and third scattering particles 255c. The third scattering particles 255c may be dispersed in the third photosensitive polymer 251c. The third photosensitive polymer 251c may include, for example, an organic material having a light transmittance such as a silicon resin, epoxy resin, and the like, and include the same material as that of the first photosensitive polymer 251a and/or the second photosensitive polymer 251b. The third scattering particles 255c may scatter and emit blue light Lb and include the same material as that of the first scattering particles 255a and/or the second scattering particles 255b.

Blue light Lb emitted from the light-emitting panel 10 may be converted in color (e.g., color-converted) or transmitted without color conversion, while passing through the first color converter 250a, the second color converter 250b, and the transmission part 250c, and then, be improved in color purity while passing through the color filter 240. As an example, blue light Lb emitted from the first display element DPE1 may be converted and filtered to red light Lr while passing through the first color converter 250a and the first color filter 240a. Blue light Lb emitted from the second display element DPE2 may be converted and filtered to green light Lg while passing through the second color converter 250b and the second color filter 240b. Blue light Lb emitted from the third display element DPE3 may be transmitted and filtered to filtered to blue light Lb while passing through the transmission part 250c and the third color filter 240c.

The display apparatus 1 having the above stacked structure may be included in mobile phones, televisions, advertisement boards, tablet personal computers, notebook computers, and the like.

Figure 3:
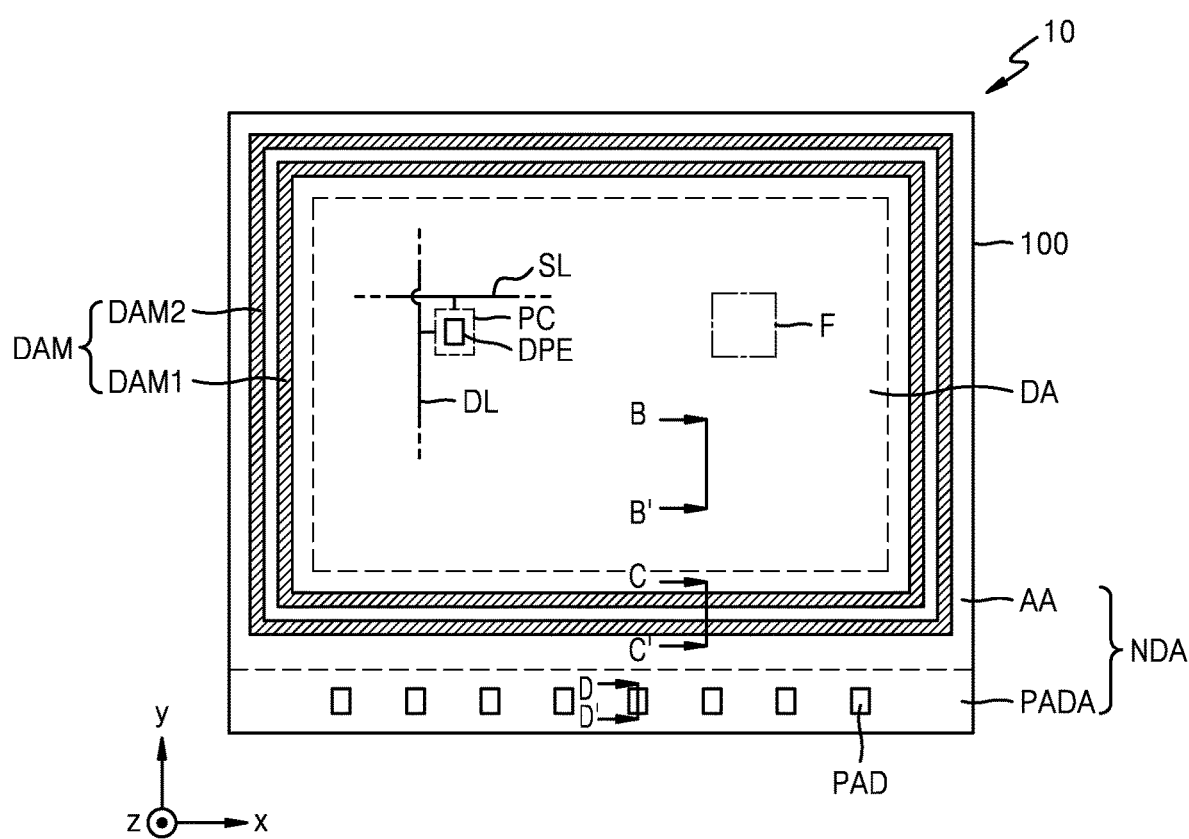
FIG. 3 is a schematic plan view of a light-emitting panel according to an embodiment.

FIG. 3 is a schematic plan view of the light-emitting panel 10 according to an embodiment.

Referring to FIG. 3, the light-emitting panel 10 may include the substrate 100, a scan line SL, a data line DL, a pixel circuit PC, the display element DPE, a dam, and a pad. The display area DA and the non-display area NDA may be defined in the light-emitting panel 10. In an embodiment, the display area DA and the non-display area NDA may be defined in the substrate 100. In other words, the substrate 100 may include the display area DA and the non-display area NDA. Hereinafter, the case where the substrate 100 includes the display area DA and the non-display area NDA is mainly described in detail.

The pixel circuit PC and the display element DPE may be arranged in the display area DA. In an embodiment, a plurality of pixel circuits PC and a plurality of display elements DPE may be arranged in the display area DA. The plurality of display elements DPE may each be driven or controlled to emit light.

The non-display area NDA may be a region in which the display element DPE is not arranged. In an embodiment, a driving circuit or a power voltage line may be arranged in the non-display area NDA, the driving circuit providing electric signals to the pixel circuit PC and the power voltage line providing power to the pixel circuit PC. The non-display area NDA may at least partially surround the display area DA. In an embodiment, the non-display area NDA may surround the display area DA entirely. The non-display area NDA may include an adjacent area AA and a pad area PADA. The adjacent area AA may be adjacent to the display area DA. The pad area PADA may be arranged outside the adjacent area AA. Though it is shown in FIG. 3 that the pad area PADA is arranged in (or along) a −y direction to be outside the adjacent area AA, the pad area PADA may be arranged outside the adjacent area AA in an embodiment in the y direction, the −y direction (e.g., direction opposite to the y direction), an x direction, and/or a −x direction (e.g., direction opposite to the x direction).

The substrate 100 may include glass. In an embodiment, the substrate 100 may include a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, and the like. In an embodiment, the substrate 100 may have a multi-layered structure including a base layer and a barrier layer (not shown) each including the polymer resin. Hereinafter, the case where the substrate 100 includes glass is mainly described in detail.

The scan line SL may be electrically connected to the pixel circuit PC. In an embodiment, the scan line SL may extend in the x direction of FIG. 3. The data line DL may be electrically connected to the pixel circuit PC. In an embodiment, the data line DL may extend in the y direction of FIG. 3.

The pixel circuit PC may be electrically connected to the scan line SL and the data line DL, the scan line SL transferring scan signals, and the data line DL transferring data signals. The pixel circuit PC may receive a scan signal and a data signal to drive the display element DPE.

The display element DPE may be arranged in the display area DA. The display element DPE may be connected to and driven by the pixel circuit PC. In an embodiment, the display element DPE may be an organic light-emitting diode including an organic emission layer. Alternatively, the display element DPE may be a light-emitting diode (LED) including an inorganic emission layer. The size of the light-emitting diode (LED) may be micro scale or nano scale. As an example, the light-emitting diode may be a micro light-emitting diode. Alternatively, the light-emitting diode may be a nanorod light-emitting diode. The nanorod light-emitting diode may include gallium nitride (GaN). Alternatively, the display element DPE may be a quantum-dot light-emitting diode including quantum dots.

The dam DAM may be arranged in the adjacent area AA. The dam DAM may at least partially surround the display area DA. In an embodiment, the dam DAM may surround the display area DA entirely. The dam DAM may have a shape protruding from the substrate 100 in a z direction of FIG. 3. An encapsulation layer 130 may be arranged on the display element DPE, the encapsulation layer 130 including at least one inorganic encapsulation layer and at least one organic encapsulation layer, to prevent or reduce the deterioration of the display element DPE. In this case, while the light-emitting panel 10 is manufactured, an organic material forming the at least one organic encapsulation layer may overflow from the display area DA to the adjacent area AA. The dam DAM may prevent or reduce the organic material forming the organic encapsulation layer from overflowing from the display area DA to the adjacent area AA while the light-emitting panel 10 is manufactured.

The dam DAM may include a first dam DAM1 and a second dam DAM2. The second dam DAM2 may surround the first dam DAM1 and may be further from the display area DA than the first dam DAM1. In an embodiment, one of the first dam DAM1 or the second dam DAM2 may be omitted. In an embodiment, the dam DAM may further include a third dam (not shown) surrounding the second dam DAM2 and further from the display area DA than the second dam DAM2.

The pad PAD may be arranged in the pad area PADA. In an embodiment, the pad PAD may be provided in plurality. The pad PAD may electrically connect the elements of the display apparatus 1 to the light-emitting panel 10. As an example, the light-emitting panel 10 may be electrically connected to a driving chip and/or a printed circuit board through the pad PAD. The driving chip may include an integrated circuit (IC). The printed circuit board may be a flexible printed circuit board (FPCB) or a rigid printed circuit board (PCB) that is relatively hard and thus is not easily bent. Alternatively, depending on the case, the printed circuit board may be a composite printed circuit board including both the rigid PCB and the FPCB. In an embodiment, a chip including an IC may be arranged on the PCB.

Figure 4:
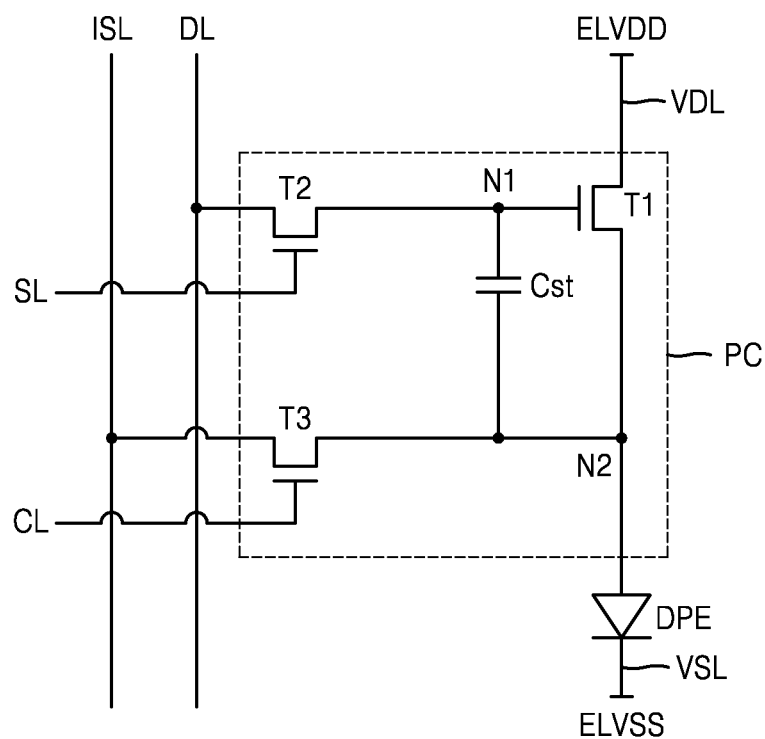
FIG. 4 is an equivalent circuit diagram of a pixel circuit and a display element of a light-emitting panel according to an embodiment.

FIG. 4 is an equivalent circuit diagram of the pixel circuit PC and the display element DPE of the light-emitting panel 10 according to an embodiment.

Referring to FIG. 4, the display element DPE may be electrically connected to the pixel circuit PC. In an embodiment, a pixel electrode 121 of the display element DPE may be electrically connected to the pixel circuit PC, and an opposite electrode 125 of the display element DPE may be electrically connected to a common voltage line VSL providing a common power voltage ELVSS. The display element DPE may emit light at a brightness corresponding to the amount of (electrical) current supplied from the pixel circuit PC.

The pixel circuit PC may be configured to control the amount of current flowing from a driving voltage line VDL to a common voltage line VSL, through the display element DPE, according to a data signal. The pixel circuit PC may include a first transistor T1, a second transistor T2, a third transistor T3, and a storage capacitor Cst.

The first transistor T1, the second transistor T2, and the third transistor T3 may each be an oxide semiconductor thin-film transistor including a semiconductor layer including an oxide semiconductor, or a silicon semiconductor thin-film transistor including a semiconductor layer including polycrystalline silicon. Depending on the type of a transistor, a first electrode E1 may be one of a source electrode and a drain electrode, and a second electrode E2 may be another of the source electrode and the drain electrode.

The first transistor T1 may be a driving transistor. A first electrode E1 of the first transistor T1 may be electrically connected to the driving voltage line VDL supplying a driving power voltage ELVDD, and a second electrode E2 of the first transistor T1 may be electrically connected to a pixel electrode 121 of the display element DPE. A gate electrode GE of the first transistor T1 may be electrically connected to a first node N1. The first transistor T1 may be configured to control the amount of current flowing from the driving voltage line VDL to the display element DPE according to the voltage of the first node N1.

The second transistor T2 may be a switching transistor. A first electrode E1 of the second transistor T2 may be electrically connected to the data line DL, and a second electrode E2 of the second transistor T2 may be electrically connected to the first node N1. A gate electrode GE of the second transistor T2 may be electrically connected to the scan line SL. When a scan signal is supplied to the scan line SL, the second transistor T2 may be turned on to electrically connect the data line DL to the first node N1.

The third transistor T3 may be an initialization transistor and/or a sensing transistor. A first electrode E1 of the third transistor T3 may be electrically connected to a second node N2, and a second electrode E2 of the third transistor T3 may be electrically connected to an initialization-sensing line ISL. A gate electrode GE of the third transistor T3 may be electrically connected to a control line CL.

When a control signal is supplied to the control line CL, the third transistor T3 may be turned on to electrically connect the initialization-sensing line ISL to the second node N2. In an embodiment, the third transistor T3 may be turned on according to a signal transferred through the control line CL, and may initialize the pixel electrode 121 of the display element DPE by using an initialization voltage from the initialization-sensing line ISL. In an embodiment, when a control signal is supplied to the control line CL, the third transistor T3 may be turned on to generate characteristic information of the display element DPE. The third transistor T3 may have both a function of the initialization transistor and a function of the sensing transistor, or have one of the functions. In an embodiment, in the case where the third transistor T3 has a function as the initialization transistor, the initialization-sensing line ISL may be denoted by an initialization voltage line. In the case where the third transistor T3 has a function as the sensing transistor, the initialization-sensing line ISL may be denoted by a sensing line. An initialization operation and a sensing operation of the third transistor T3 may be performed individually or simultaneously. Hereinafter, for convenience of description, the case where the third transistor T3 has both the function of the initialization transistor and the function of the sensing transistor is mainly described in detail.

The storage capacitor Cst may be connected between the first node N1 and the second node N2. As an example, a first capacitor electrode CE1 of the storage capacitor Cst may be electrically connected to the pixel electrode 121 of the display element DPE, and a second capacitor electrode CE2 of the storage capacitor Cst may be electrically connected to the gate electrode GE of the first transistor T1.

Though it is shown in FIG. 4 that the first transistor T1, the second transistor T2, and the third transistor T3 are n-channel metal-oxide-semiconductor (NMOS) transistors, at least one of the first transistor T1, the second transistor T2, and the third transistor T3 may be provided as a p-channel metal-oxide-semiconductor (PMOS) transistor in another embodiment.

Though FIG. 4 shows three transistors, the pixel circuit PC may include four or more transistors in an embodiment.

Figure 5A:
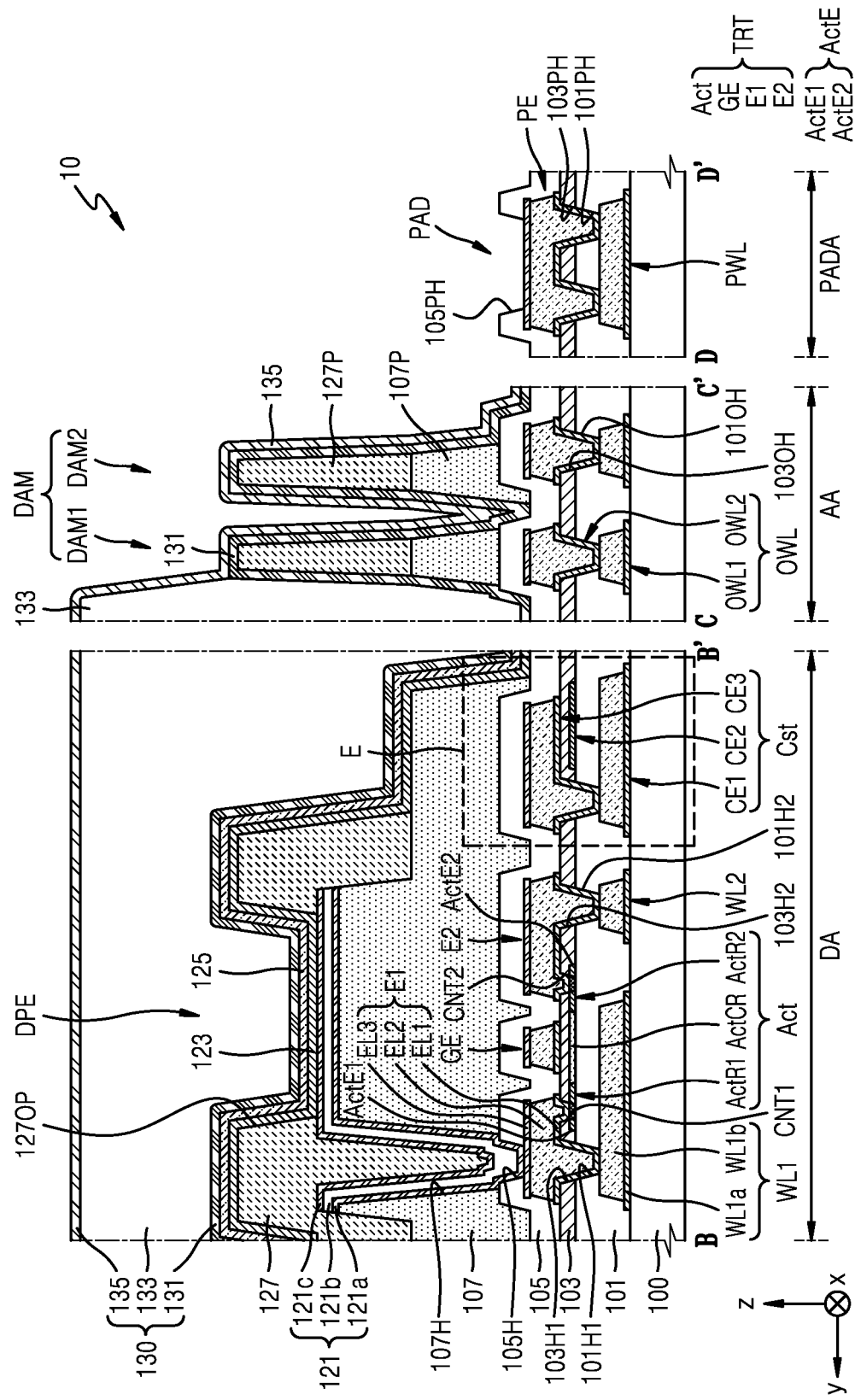
FIG. 5A is a schematic cross-sectional view of a light-emitting panel, taken along lines B-B', C-C', and D-D' of FIG. 3, according to an embodiment.
Figure 5B:
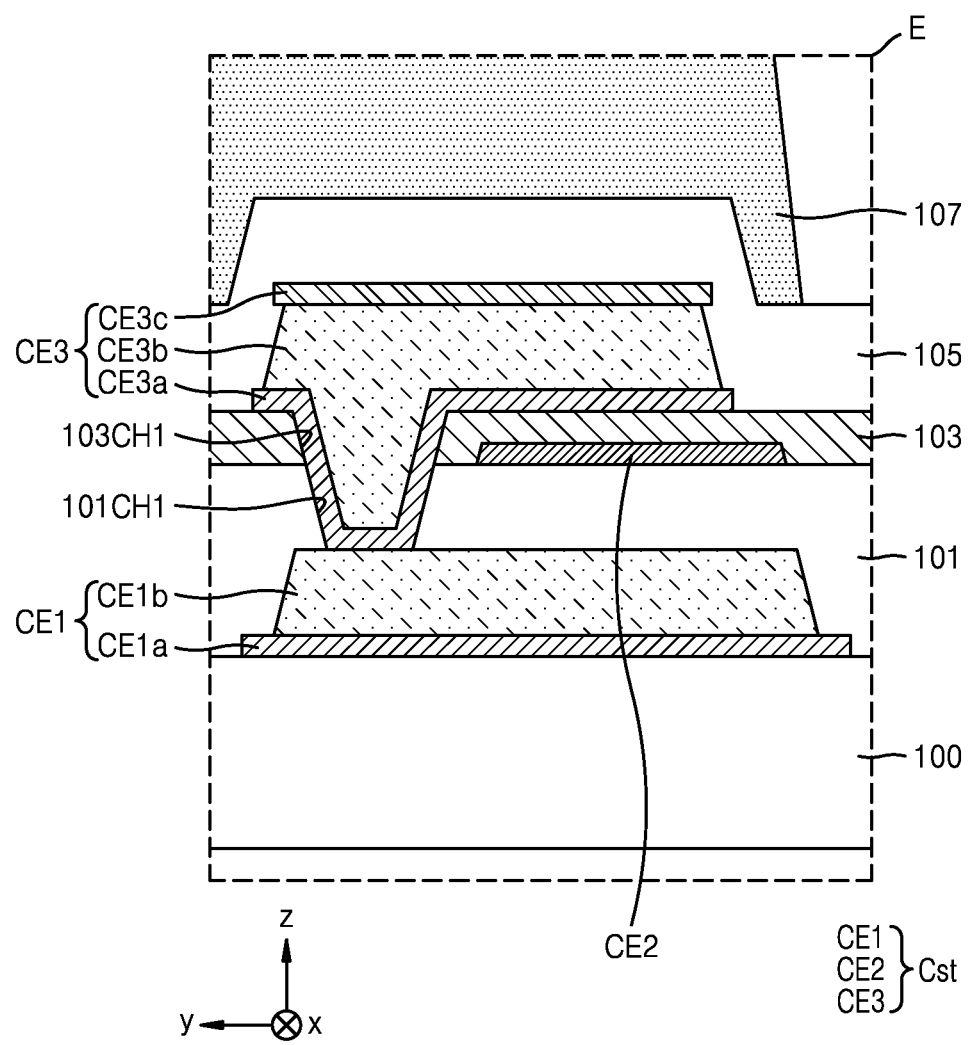
FIG. 5B is an enlarged cross-sectional view of a region E of the light-emitting panel of FIG. 5A.

FIG. 5A is a schematic cross-sectional view of the light-emitting panel 10, taken along lines B-B', C-C', and D-D' of FIG. 3, according to an embodiment. FIG. 5B is an enlarged view of a region E of the light-emitting panel 10 of FIG. 5A. In FIG. 5B, elements arranged above the organic insulating layer 107 are omitted.

Referring to FIGS. 5A and 5B, the light-emitting panel 10 may include the substrate 100, a pixel circuit layer, a display element layer, and the encapsulation layer 130. The substrate 100 may include the display area DA, the adjacent area AA, and the pad area PADA. The adjacent area AA may be outside the display area DA. The pad area PADA may be arranged outside the adjacent area AA. In an embodiment, the substrate 100 may include glass.

The pixel circuit layer may be arranged on the substrate 100. The pixel circuit layer may include a wiring, a transistor TRT, the storage capacitor Cst, a buffer layer 101, a first inorganic insulating layer 103, a second inorganic insulating layer 105, an organic insulating layer 107, a first insulating pattern 107P, and the pad. The transistor TRT may include a semiconductor layer Act, a gate electrode GE, a first electrode E1, and a second electrode E2. In an embodiment, the storage capacitor Cst may include a first capacitor electrode CE1, a second capacitor electrode CE2, and a third capacitor electrode CE3. The first capacitor electrode CE1, the second capacitor electrode CE2, and the third capacitor electrode CE3 may be arranged in the display area DA and may overlap one another. The pad PAD may include a pad electrode PE.

The wiring may be arranged on the substrate 100. The wiring may be a signal line and/or a power voltage line. As an example, the wiring may be a data line DL, a driving voltage line VDL, a common voltage line VSL, and/or an initialization-sensing line ISL. In an embodiment, the wiring may include a first wiring WL1, a second wiring WL2, an outer wiring OWL, and a pad wiring PWL. The first wiring WL1 and the second wiring WL2 may be arranged in the display area DA. The first wiring WL1 and the second wiring WL2 may be configured to transfer (electrical) signals and/or a power voltage to the transistor TRT. The outer wiring OWL may be arranged in the adjacent area AA. In an embodiment, the outer wiring OWL may be provided in plurality. The outer wiring OWL may include a first outer wiring OWL1 and a second outer wiring OWL2. The outer wiring OWL may be configured to transfer signals and/or a power voltage to the display area DA, the signals and/or the power voltage being transferred from the pad wiring PWL. The pad wiring PWL may be configured to transfer signals and/or the power voltage to the outer wiring OWL, the signals and/or the power voltage being transferred from a pad electrode PE of the pad PAD.

The first wiring WL1, the second wiring WL2, the first capacitor electrode CE1, the first outer wiring OWL1, and the pad wiring PWL may be arranged on the same layer. The first wiring WL1, the second wiring WL2, the first capacitor electrode CE1, the first outer wiring OWL1, and the pad wiring PWL may together provide a first signal line layer or first conductive layer. In other words, the first wiring WL1, the second wiring WL2, the first capacitor electrode CE1, the first outer wiring OWL1, and the pad wiring PWL may be arranged between the substrate 100 and the buffer layer 101. The first wiring WL1, the second wiring WL2, the first capacitor electrode CE1, the first outer wiring OWL1, and the pad wiring PWL may include the same material and be formed during the same process. Hereinafter, the first wiring WL1 is mainly described in detail. As being on a same layer, including a same material and/or formed in a same process, elements may be in a same layer as each other as respective portions of a same material layer, may be on a same layer by forming an interface with a same underlying or overlying layer, between the same two layer, etc., without being limited thereto.

The first wiring WL1 may include a conductive material including molybdenum (Mo), aluminum (Al), copper (Cu), and titanium (Ti) and have a single-layered structure or a multi-layered structure including the above materials. In an embodiment, the first wiring WL1 may include a first wiring layer WL1a and a second wiring layer WL1b. The first wiring layer WL1a may include titanium (Ti). The second wiring layer WL1b may be arranged on the first wiring layer WL1a. The second wiring layer WL1b may include a material having high conductivity. As an example, the second wiring layer WL1b may include copper (Cu). In an embodiment, the first wiring layer WL1a of the first wiring WL1 may be omitted. In an embodiment, the first wiring WL1 may further include a third wiring layer.

In an embodiment, the first capacitor electrode CE1 may include a first layer CE1a of the first capacitor electrode CE1 and a second layer CE1b of the first capacitor electrode CE1. In an embodiment, the first layer CE1a of the first capacitor electrode CE1 may include the same material as that of the first wiring layer WL1a. The second layer CE1b of the first capacitor electrode CE1 may include the same material as that of the second wiring layer WL1b.

The buffer layer 101 may be arranged on the wiring. In an embodiment, the buffer layer 101 may be arranged on the first wiring WL1, the second wiring WL2, the first capacitor electrode CE1, the first outer wiring OWL1, and the pad wiring PWL. The buffer layer 101 may include a hole, and the hole may be provided in plural including a plurality of buffer layer holes. In an embodiment, the buffer layer 101 may include a first buffer layer hole 101H1, a second buffer layer hole 101H2, a first buffer layer connection hole 101CH1, a first outer hole 101OH, and a first pad hole 101PH. The first buffer layer hole 101H1 may overlap the first wiring WL1 and expose the first wiring WL1 to outside of the buffer layer 101. The second buffer layer hole 101H2 may overlap the second wiring WL2 and expose the second wiring WL2. The first buffer layer connection hole 101CH1 may overlap the first capacitor electrode CE1 and expose the first capacitor electrode CE1. The first outer hole 101OH may overlap the first outer wiring OWL1 and expose the first outer wiring OWL1. In an embodiment, the first outer hole 101OH may be provided in plurality. The first pad hole 101PH may overlap the pad wiring PWL and expose the pad wiring PWL.

The buffer layer 101 may include an inorganic insulating material such as silicon nitride ($SiN_x$), silicon oxynitride (SiON), and silicon oxide ($SiO_2$), and include a single layer or a multi-layer including the inorganic insulating materials.

The semiconductor layer Act and the second capacitor electrode CE2 may be arranged on a same layer (e.g., the buffer layer 101). The semiconductor layer Act and the second capacitor electrode CE2 may each include an oxide semiconductor. As an example, the semiconductor layer Act and the second capacitor electrode CE2 may each include Zn-oxide-based material and include Zn-oxide, In—Zn oxide, and Ga—In—Zn oxide. Alternatively, the semiconductor layer Act and the second capacitor electrode CE2 may each include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

The semiconductor layer Act may include a channel region ActCR, a first region ActR1, and a second region ActR2. The channel region ActCR may be arranged between the first region ActR1 and the second region ActR2 in a direction along the substrate 100 and/or the buffer layer 101. The first region ActR1 and the second region ActR2 may each extend from the channel region ActCR, to provide an edge ActE of the semiconductor layer Act. The first region ActR1 may extend from the channel region ActCR to provide a first edge ActE1 of the semiconductor layer Act. The second region ActR2 may extend from the channel region ActCR to provide a second edge ActE2 of the semiconductor layer Act. The first region ActR1 and the second region ActR2 are regions having a lower (electrical) resistance than that of the channel region ActCR, and may correspond to a source region or a drain region. In an embodiment, the first region ActR1 and the second region ActR2 may be doped with impurities. That is, the first region ActR1 and the second region ActR2 may be doped regions.

The second capacitor electrode CE2 may have a lower resistance than that of the channel region ActCR. Impurities may be added to the second capacitor electrode CE2.

That is, the second capacitor electrode CE2 may be doped. Accordingly, the second capacitor electrode CE2 may serve as an electrode plate of the storage capacitor Cst.

The first inorganic insulating layer 103 may cover the semiconductor layer Act and the second capacitor electrode CE2. The first inorganic insulating layer 103 may continuously extend from the display area DA, through the active area AA, and to the pad area PADA. The first inorganic insulating layer 103 may cover the first edge ActE1 of the semiconductor layer Act. The first inorganic insulating layer 103 may cover the second edge ActE2 of the semiconductor layer Act. The first inorganic insulating layer 103 may include a plurality of first inorganic insulating layer holes. In an embodiment, the first inorganic insulating layer 103 may include a first contact hole CNT1, a second contact hole CNT2, a first hole 103H1, a second hole 103H2, a first inorganic insulating layer connection hole 103CH1, a second outer hole 103OH, and a second pad hole 103PH. The first contact hole CNT1 may overlap the first region ActR1 and expose the first region ActR1 to outside the first inorganic insulating layer 103. The second contact hole CNT2 may overlap the second region ActR2 and expose the second region ActR2. The first hole 103H1 may overlap and be connected to the first buffer layer hole 101H1. The second hole 103H2 may overlap and be connected to the second buffer layer hole 101H2. The first inorganic insulating layer connection hole 103CH1 may overlap and be connected to the first buffer layer hole 101H1. The second outer hole 103OH may overlap and be connected to the first outer hole 101OH. The second pad hole 103PH may overlap and be connected to the first pad hole 101PH.

The first inorganic insulating layer 103 may continuously extend between holes adjacent to each other. As an example, the first inorganic insulating layer 103 may continuously extend between the first contact hole CNT1 and the second contact hole CNT2. Accordingly, the first inorganic insulating layer 103 may overlap the first region ActR1, the channel region ActCR, and the second region ActR2 of the semiconductor layer Act.

The semiconductor layer Act except the regions overlapping the first contact hole CNT1 and the second contact hole CNT2, may not be exposed to outside the first inorganic insulating layer 103. In addition, the second capacitor electrode CE2 may not be exposed to outside the first inorganic insulating layer 103. Accordingly, the semiconductor layer Act and the second capacitor electrode CE2 may be prevented or reduced from being damaged during a process of manufacturing (or providing) a display apparatus 1.

In an embodiment, the first inorganic insulating layer 103 may include silicon oxide ($SiO_2$). In this case, the first inorganic insulating layer 103 may prevent or reduce external materials from penetrating to the semiconductor layer Act and the second capacitor electrode CE2. Accordingly, the semiconductor layer Act and the second capacitor electrode CE2 may prevent or reduce hydrogen from diffusing from the second inorganic insulating layer 105. In another embodiment, the first inorganic insulating layer 103 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). In an embodiment, zinc oxide ($ZnO_x$) may be ZnO and/or $ZnO_2$.

The first electrode E1, the second electrode E2, the third capacitor electrode CE3, the second outer wiring OWL2, and the pad electrode PE may be arranged on a same layer (e.g., the first inorganic insulating layer 103). The first electrode E1 may overlap the first region ActR1 and be electrically connected to the first region ActR1 through (or at) the first contact hole CNT1. The second electrode E2 may overlap the second region ActR2 and be electrically connected to the second region ActR2 through the second contact hole CNT2. In an embodiment, the first electrode E1 may overlap the first contact hole CNT1 entirely in a plan view. The second electrode E2 may overlap the second contact hole CNT2 entirely in a plan view. In the present embodiment, as described below, the first region ActR1 and the second region ActR2 may be doped with impurities when the semiconductor layer Act is formed. The first electrode E1 and the second electrode E2 may be formed to overlap the first region ActR1 and the second region ActR2, respectively. Accordingly, even though the first electrode E1 and the second electrode E2 respectively overlap the first region ActR1 and the second region ActR2, the first region ActR1 and the second region ActR2 may each be in a state doped with impurities and may maintain a low (electrical) resistance.

The first electrode E1 may be electrically connected to the first wiring WL1 through the first buffer layer hole 101H1 and the first hole 103H1. The second electrode E2 may be electrically connected to the second wiring WL2 through the second buffer layer hole 101H2 and the second hole 103H2. Accordingly, the transistor TRT may receive signals and/or a power voltage from the first wiring WL1 and/or the second wiring WL2.

The gate electrode GE may overlap the channel region ActCR. In an embodiment, the gate electrode GE may be (spaced) apart from the first electrode E1 and the second electrode E2. In an embodiment, the gate electrode GE may be arranged between the first electrode E1 and the second electrode E2 in a direction along the first inorganic insulating layer 103. The gate electrode GE, the first electrode E1 and the second electrode E2 may together form an electrode layer of a respective transistor.

The third capacitor electrode CE3 may overlap the second capacitor electrode CE2. In an embodiment, the third capacitor electrode CE3 may be electrically connected to the first capacitor electrode CE1 through the first buffer layer connection hole 101CH1 and the first inorganic insulating layer connection hole 103CH1.

The second outer wiring OWL2 may be arranged in the adjacent area AA. In an embodiment, the second outer wiring OWL2 may be provided in plurality. In an embodiment, the second outer wiring OWL2 may be connected to the first outer wiring OWL1 through the first outer hole 101OH and the second outer hole 103OH.

The pad electrode PE may be arranged in the pad area PADA. The pad electrode PE may be electrically connected to the pad wiring PWL through the first pad hole 101PH the second pad hole 103PH. Accordingly, the pad electrode PE may be configured to transfer signals and/or a power voltage to the pad wiring PWL, the signals and/or the power voltage being supplied from outside of the light-emitting panel 10.

The first electrode E1, the second electrode E2, the gate electrode GE, the third capacitor electrode CE3, the second outer wiring OWL2, and the pad electrode PE may be arranged on the same layer. In other words, the first electrode E1, the second electrode E2, the gate electrode GE, the third capacitor electrode CE3, the second outer wiring OWL2, and the pad electrode PE may be arranged between the first inorganic insulating layer 103 and the second inorganic insulating layer 105. The first electrode E1, the second electrode E2, the gate electrode GE, the third capacitor electrode CE3, the second outer wiring OWL2, and the pad electrode PE may include the same material and/or be formed during the same process. Hereinafter, the first electrode E1 is mainly described in detail.

The first electrode E1 may include a conductive material including molybdenum (Mo), aluminum (Al), copper (Cu), and titanium (Ti) and have a single-layered structure or a multi-layered structure including the above materials. In an embodiment, the first electrode E1 may include a transparent conductive material. As an example, the first electrode E1 may include a conductive oxide such as indium tin oxide (ITO), indium zinc oxide (IZO), ZnO, indium oxide ($In_2O_3$), indium gallium oxide (IGO), or aluminum zinc oxide (AZO). In an embodiment, the first electrode E1 may include a first electrode layer EL1, a second electrode layer EL2, and a third electrode layer EL3. The first electrode layer EL1 may include titanium (Ti). The second electrode layer EL2 may be arranged on the first electrode layer EL1. The second electrode layer EL2 may include copper (Cu). The third electrode layer EL3 may be arranged on the second electrode layer EL2. The third electrode layer EL3 may include indium tin oxide. In this case, the third electrode layer EL3 may prevent or reduce the second electrode layer EL2 from being damaged during a process of manufacturing the display apparatus 1. In an embodiment, in the case where the second electrode layer EL2 has chemical resistance, the third electrode layer EL3 may be omitted.

In an embodiment, the third capacitor electrode CE3 may include a first layer CE3a of the third capacitor electrode CE3, a second layer CE3b of the third capacitor electrode CE3, and a third layer CE3c of the third capacitor electrode CE3. In an embodiment, the first layer CE3a of the third capacitor electrode CE3 may include the same material as that of the first electrode layer EL1. In an embodiment, the second layer CE3b of the third capacitor electrode CE3 may include the same material as that of the second electrode layer EL2. In an embodiment, the third layer CE3c of the third capacitor electrode CE3 may include the same material as that of the third electrode layer EL3.

The storage capacitor Cst may include the first capacitor electrode CE1, the second capacitor electrode CE2, and the third capacitor electrode CE3. The second capacitor electrode CE2 may be doped with impurities and may include an oxide semiconductor having a low resistance. Accordingly, since the second capacitor electrode CE2 may serve as an electrode plate, the storage capacitor Cst is a dual storage capacitor and thus has an increased capacity. In an embodiment, the third capacitor electrode CE3 may be omitted.

The second inorganic insulating layer 105 may cover the first electrode E1, the second electrode E2, the gate electrode GE, the second outer wiring OWL2, and the pad electrode PE. In an embodiment, the second inorganic insulating layer 105 may continuously extend. The second inorganic insulating layer 105 may include a lower hole 105H and a third pad hole 105PH. The lower hole 105H may overlap one of the first electrode E1 and the second electrode E2, and expose one of the first electrode E1 and the second electrode E2 to outside the second inorganic insulating layer 105. The third pad hole 105PH may overlap and expose the pad electrode PE.

The second inorganic insulating layer 105 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). In an embodiment, zinc oxide ($ZnO_x$) may be ZnO and/or $ZnO_2$.

The organic insulating layer 107 may be arranged on the second inorganic insulating layer 105. The organic insulating layer 107 may include an organic insulating layer hole 107H overlapping and connected to the lower hole 105H. In an embodiment, the upper surface of the organic insulating layer 107 may be flat. In an embodiment, the organic insulating layer 107 may have a step difference. As an example, a distance from the substrate 100 to the upper surface of the organic insulating layer 107 which is furthest from the substrate 100 in a region where a pixel electrode 121 is arranged, may be greater than a distance from the substrate 100 to the upper surface of the organic insulating layer 107 which is furthest from the substrate 100 in a region where the pixel electrode 121 is not arranged (e.g., adjacent to the pixel electrode 121). The organic insulating layer 107 may include an organic material. The organic insulating layer 107 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The first insulating pattern 107P may be arranged in the adjacent area AA. In an embodiment, the first insulating pattern 107 may be arranged on the second inorganic insulating layer 105. In an embodiment, the first insulating pattern 107P may be provided in plurality in the adjacent area AA. In an embodiment, the first insulating pattern 107P may include the same material as that of the organic insulating layer 107. The first insulating pattern 107P and the organic insulating layer 107 may be formed during the same process.

The display element layer may be arranged on the pixel circuit layer. The display element layer may include the display element DPE, the pixel-defining layer 127, and a second insulating pattern 127P. The display element DPE may include the pixel electrode 121, an emission layer 123, and an opposite electrode 125 in order. In an embodiment, the display element DPE may be arranged on the second inorganic insulating layer 105.

The pixel electrode 121 may be arranged on the organic insulating layer 107. The pixel electrode 121 may be electrically connected to one of the first electrode E1 and the second electrode E2, through the lower hole 105H and the organic insulating layer hole 107H. In an embodiment, the pixel electrode 121 may include a first pixel electrode layer 121a, a second pixel electrode layer 121b, and a third pixel electrode layer 121c. The first pixel electrode layer 121a may include a conductive oxide such as indium tin oxide (ITO), indium zinc oxide (IZO), ZnO, indium oxide ($In_2O_3$), indium gallium oxide (IGO), or aluminum zinc oxide (AZO). The second pixel electrode layer 121b may include a reflective layer including silver (Ag), magnesium (Mg), aluminum (Al), platinum (Pt), palladium (Pd), gold (Au), nickel (N1), neodymium (Nd), iridium (Ir), chrome (Cr), or a compound thereof. The third pixel electrode layer 121c may include a conductive oxide such as indium tin oxide (ITO), indium zinc oxide (IZO), ZnO, indium oxide ($In_2O_3$), indium gallium oxide (IGO), or aluminum zinc oxide (AZO).

The pixel-defining layer 127 may include a pixel opening 1270P overlapping the pixel electrode 121 and cover the edges of the pixel electrode 121. In an embodiment, the pixel opening 1270P may define an emission area of light emitted from the display element DPE. As an example, the width of the pixel opening 1270P may correspond to the width of the emission area. In addition, the width of the pixel opening 1270P may correspond to the width of a sub-pixel. The width may be a dimension along an underlying layer, such as along the x direction and/or the y direction. The width may be a dimension along a plane defined by the x direction and the y direction crossing each other.

In an embodiment, the pixel-defining layer 127 may include an organic insulating material. In an embodiment, the pixel-defining layer 127 may include an inorganic insulating material such as silicon nitride ($SiN_x$), silicon oxynitride (SiON), and silicon oxide ($SiO_2$). In another embodiment, the pixel-defining layer 127 may include an organic insulating material and an inorganic insulating material. In an embodiment, the pixel-defining layer 127 may include a light-blocking material and be provided in black. The light-blocking material may include carbon black, carbon nanotubes, a resin or paste including black dye, metal particles, for example, nickel, aluminum, molybdenum, and an alloy thereof, metal oxide particles (e.g., chrome oxide), or metal nitride particles (e.g., chrome nitride). In the case where the pixel-defining layer 127 includes a light-blocking material, external light reflection by a metal structure arranged below the pixel-defining layer 127 may be reduced.

The emission layer 123 may be arranged in the pixel opening 1270P of the pixel-defining layer 127. In an embodiment, the emission layer 123 may continuously extend in the display area DA. The emission layer 123 may include a polymer organic material or a low-molecular weight organic material emitting light having a color. Though not shown, a first functional layer and a second functional layer may be respectively arranged under and on the emission layer 123. The first functional layer may include, for example, a hole transport layer (HTL), or include an HTL and a hole injection layer (HIL). The second functional layer is an element arranged on the emission layer 123 and is optional. The second functional layer may include an electron transport layer (ETL) and/or an electron injection layer (EIL).

The opposite electrode 125 may be arranged on the emission layer 123. In an embodiment, the opposite electrode 125 may continuously extend in the display area DA. The opposite electrode 125 may include a conductive material having a low work function. As an example, the opposite electrode 125 may include a (semi) transparent layer including silver (Ag), magnesium (Mg), aluminum (Al), platinum (Pt), palladium (Pd), gold (Au), nickel (Nl), neodymium (Nd), iridium (Ir), chrome (Cr), or an alloy thereof.

Alternatively, the opposite electrode 125 may further include a layer on the (semi) transparent layer, the layer including ITO, IZO, ZnO, or $In_2O_3$.

In an embodiment, one display element DPE may include a plurality of emission layers 123 sequentially stacked. As an example, one display element DPE may include a first emission layer and a second emission layer sequentially stacked in a direction away from the pixel electrode 121. A negative charge-generating layer and a positive charge-generating layer may be arranged between emission layers adjacent to each other. As an example, the negative charge-generating layer and the positive charge-generating layer may be arranged between the first emission layer and the second emission layer. In this case, one display element DPE may include the pixel electrode 121, the first emission layer, the negative charge-generating layer, the positive charge-generating layer, the second emission layer, and the opposite electrode 125. The negative charge-generating layer may supply electrons. The negative charge-generating layer may be an n-type electric charge-generating layer. The negative charge-generating layer may include a host and dopants. The host may include an organic material. The dopants may include metal materials. The positive charge-generating layer may be a p-type electric charge-generating layer. The positive charge-generating layer may supply holes. The positive charge-generating layer may include a host and dopants. The host may include an organic material. The dopants may include metal materials.

The second insulating pattern 127P may be arranged in the adjacent area AA. In an embodiment, the second insulating pattern 127P may be arranged on the first insulating pattern 107P. In an embodiment, the second insulating pattern 127P may be provided in plurality. The second insulating pattern 127P may include the same material as that of the pixel-defining layer 127. The second insulating pattern 127P and the pixel-defining layer 127 may be formed during the same process. The first insulating pattern 107P and the second insulating pattern 127P may together constitute portions of the dam DAM. In an embodiment, the dam DAM may include the first dam DAM1 and the second dam DAM2.

The encapsulation layer 130 may be arranged on the display element layer. In an embodiment, the encapsulation layer 130 may be arranged in the display area DA. The encapsulation layer 130 may include at least one inorganic encapsulation layer and at least one organic encapsulation layer. In an embodiment, the encapsulation layer 130 includes a first inorganic encapsulation layer 131, an organic encapsulation layer 133, and a second inorganic encapsulation layer 135 that are sequentially stacked.

The first inorganic encapsulation layer 131 may continuously extend in the display area DA and the adjacent area AA. The first inorganic encapsulation layer 131 may be arranged on the opposite electrode 125 and the dam DAM.

The organic encapsulation layer 133 may be arranged in the display area DA. The organic encapsulation layer 133 may extend to the dam DAM and may terminate at the dam DAM. In an embodiment, the upper surface of the organic encapsulation layer 133 which is furthest from the substrate 100, in the display area DA, may be flat. The organic encapsulation layer 133 may include a polymer-based material. The polymer-based material may include an acryl-based resin, an epoxy-based resin, polyimide, and polyethylene. In an embodiment, the organic encapsulation layer 133 may include acrylate. An organic material forming (or providing) the organic encapsulation layer 133 may flow from the display area DA to the adjacent area AA while the light-emitting panel 10 is manufactured. The dam DAM may prevent or reduce the organic material forming the organic encapsulation layer 133 from flowing to the outer side of the adjacent area AA which is opposite to the display area DA, while the light-emitting panel 10 is manufactured.

The second inorganic encapsulation layer 135 may be arranged on the organic encapsulation layer 133. The second inorganic encapsulation layer 135 may continuously extend and directly contact the first inorganic encapsulation layer 131 on the dam DAM. The first inorganic encapsulation layer 131 and the second inorganic encapsulation layer 135 may each include at least one inorganic material among aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), and silicon nitride ($SiN_x$), silicon oxynitride (SiON).

Figure 6A:
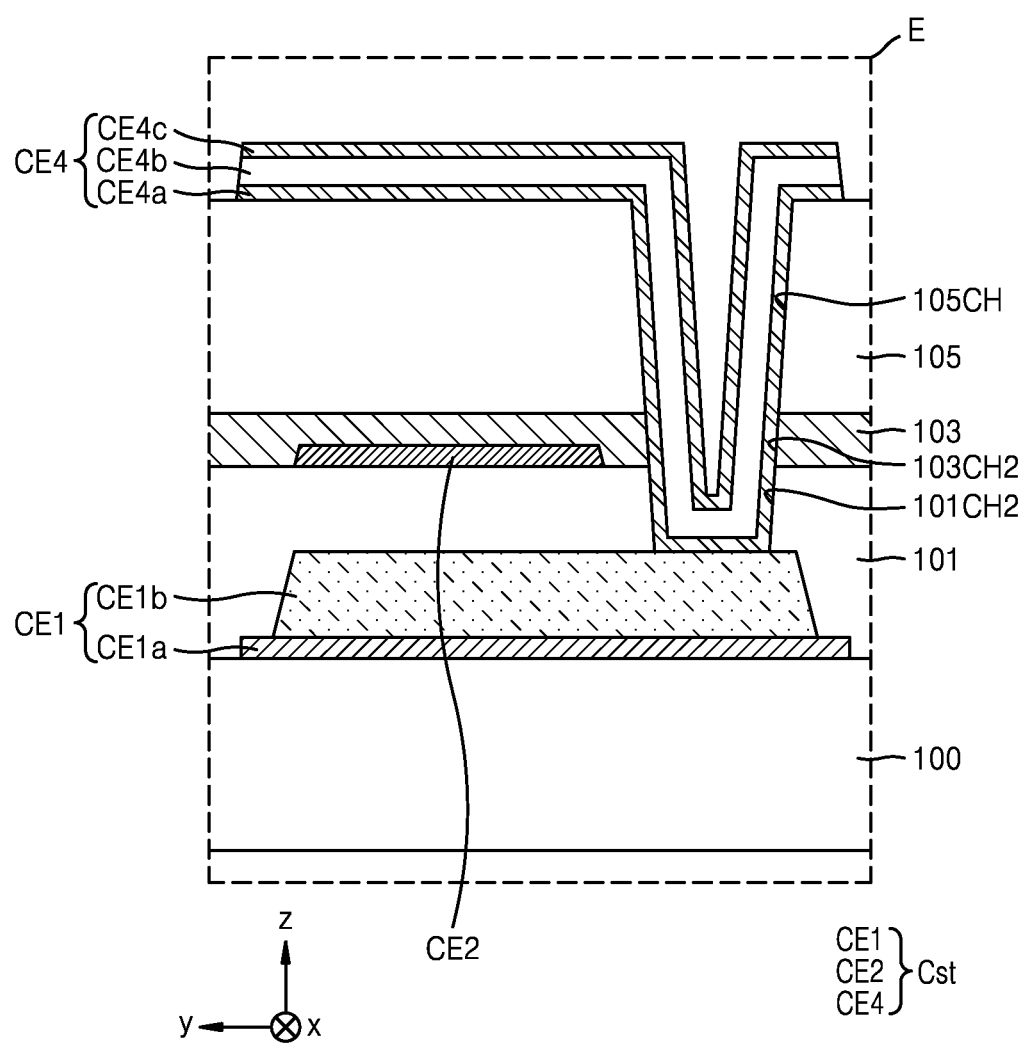
FIGS. 6A and 6B are enlarged cross-sectional views of the region E of the light-emitting panel of FIG. 5A, according to embodiments.
Figure 6B:
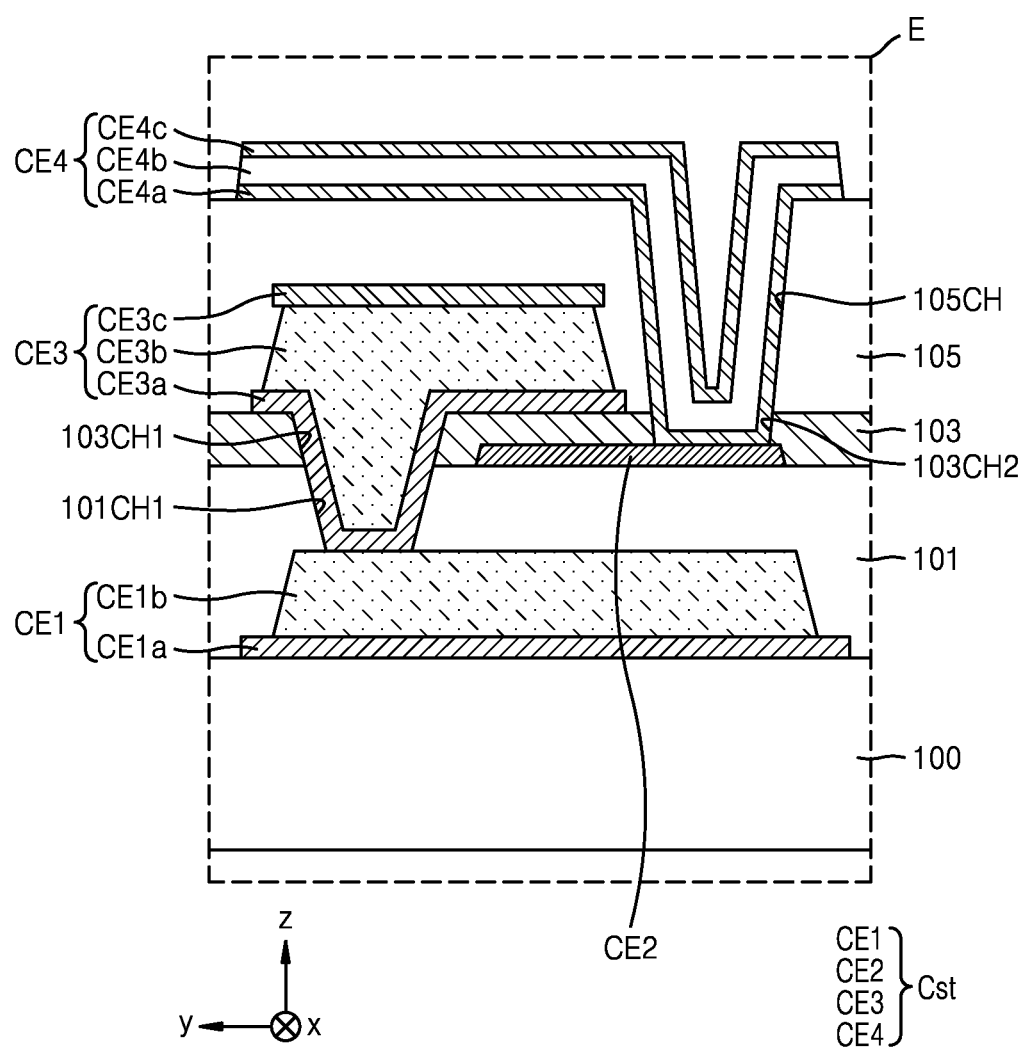

FIGS. 6A and 6B are enlarged view of a region E of the light-emitting panel 10 of FIG. 5A according to embodiments. In FIGS. 6A and 6B, elements arranged on a fourth capacitor electrode CE4 are omitted.

Referring to FIG. 6A, the storage capacitor Cst may include the first capacitor electrode CE1, the second capacitor electrode CE2, and the fourth capacitor electrode CE4. The first capacitor electrode CE1 may be arranged between the substrate 100 and the buffer layer 101. The second capacitor electrode CE2 may be arranged between the buffer layer 101 and the first inorganic insulating layer 103. The second capacitor electrode CE2 may overlap the first capacitor electrode CE1. The second capacitor electrode CE2 may include an oxide semiconductor layer and have a lower resistance than that of the channel region ActCR. In other words, impurities may be added to the second capacitor electrode CE2.

The fourth capacitor electrode CE4 may be arranged on the second inorganic insulating layer 105. The fourth capacitor electrode CE4 may overlap the second capacitor electrode CE2. In an embodiment, the buffer layer 101 may include a second buffer layer connection hole 101CH2. The second buffer layer connection hole 101CH2 may overlap and expose the first capacitor electrode CE1. In an embodiment, the first inorganic insulating layer 103 may include a second inorganic insulating layer connection hole 103CH2. The second inorganic insulating layer connection hole 103CH2 may overlap and be connected to the second buffer layer connection layer 101CH2. In an embodiment, the second buffer layer connection layer 101CH2 and the second inorganic insulating layer connection hole 103CH2 may be formed while the first buffer layer hole 101H1 and the first hole 103H1 of FIG. 5A are formed.

The second inorganic insulating layer 105 may include a third inorganic insulating layer connection hole 105CH. The third inorganic insulating layer connection hole 105CH may overlap and be connected to the second inorganic insulating layer connection hole 103CH2. The fourth capacitor electrode CE4 may be electrically connected to the first capacitor electrode CE1 through the second buffer layer connection hole 101CH2, the second inorganic insulating layer connection hole 103CH2, and the third inorganic insulating layer connection hole 105CH. In an embodiment, the third inorganic insulating layer connection hole 105CH may be formed while the lower hole 105H of FIG. 5A is formed.

The fourth capacitor electrode CE4 may include the same material as that of the pixel electrode 121. The fourth capacitor electrode CE4 and the pixel electrode 121 may be formed during the same process. In an embodiment, the fourth capacitor electrode CE4 may include a first layer CE4a of the fourth capacitor electrode CE4, a second layer CE4b of the fourth capacitor electrode CE4, and a third layer CE4c of the fourth capacitor electrode CE4. The first layer CE4a of the fourth capacitor electrode CE4 may be arranged on the second inorganic insulating layer 105. The second layer CE4b of the fourth capacitor electrode CE4 may be arranged on the first layer CE4a of the fourth capacitor electrode CE4. The third layer CE4c of the fourth capacitor electrode CE4 may be arranged on the second layer CE4b of the fourth capacitor electrode CE4. In an embodiment, the first layer CE4a of the fourth capacitor electrode CE4 may include the same material as that of the first pixel electrode layer 121a (see FIG. 5A). The second layer CE4b of the fourth capacitor electrode CE4 may include the same material as that of the second pixel electrode layer 121b (see FIG. 5A). The third layer CE4c of the fourth capacitor electrode CE4 may include the same material as that of the third pixel electrode layer 121c (see FIG. 5A).

In an embodiment, the second capacitor electrode CE2 may be doped with impurities, may include an oxide semiconductor having a low resistance, and serve as an electrode plate. In addition, the storage capacitor Cst may include the first capacitor electrode CE1, the second capacitor electrode CE2, and the fourth capacitor electrode CE4. Accordingly, the storage capacitor Cst may be a dual storage capacitor and thus has an increased capacity.

Referring to FIG. 6B, the storage capacitor Cst may include the first capacitor electrode CE1, the second capacitor electrode CE2, the third capacitor electrode CE3, and the fourth capacitor electrode CE4. The first capacitor electrode CE1 may be arranged between the substrate 100 and the buffer layer 101. The second capacitor electrode CE2 may be arranged between the buffer layer 101 and the first inorganic insulating layer 103. The second capacitor electrode CE2 may overlap the first capacitor electrode CE1. The second capacitor electrode CE2 may include an oxide semiconductor layer and have a lower resistance than that of the channel region ActCR. In other words, impurities may be added to the second capacitor electrode CE2.

The third capacitor electrode CE3 may be arranged between the first inorganic insulating layer 103 and the second inorganic insulating layer 105. The third capacitor electrode CE3 may overlap the second capacitor electrode CE2. The third capacitor electrode CE3 may be connected to the first capacitor electrode CE1 through the first buffer layer connection hole 101CH1 and the first inorganic insulating layer connection hole 103CH1.

The fourth capacitor electrode CE4 may be arranged on the second inorganic insulating layer 105. The fourth capacitor electrode CE4 may overlap the third capacitor electrode CE3. The fourth capacitor electrode CE4 may be electrically connected to the second capacitor electrode CE2 through the second inorganic insulating layer connection hole 103CH2 and the third inorganic insulating layer connection hole 105CH. In an embodiment, the second inorganic insulating layer connection hole 103CH2 and the third inorganic insulating layer connection hole 105CH may be formed while the lower hole 105H of FIG. 5A is formed.

In an embodiment, the second capacitor electrode CE2 may be doped with impurities, may include an oxide semiconductor having a low resistance, and serve as an electrode plate. In addition, the storage capacitor Cst may include the first capacitor electrode CE1, the second capacitor electrode CE2, the third capacitor electrode CE3, and the fourth capacitor electrode CE4. Accordingly, the storage capacitor Cst may have an increased capacity.

Figure 7A:
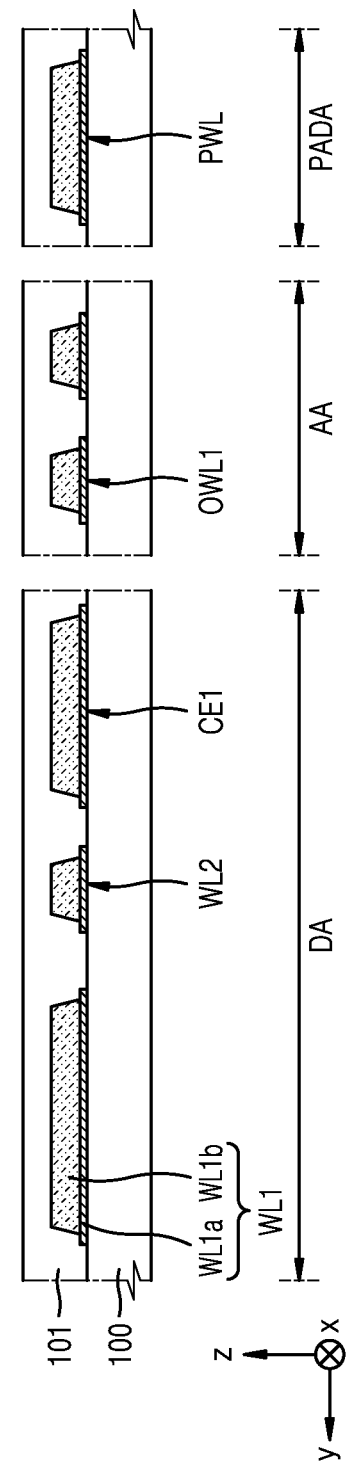
FIGS. 7A to 7R are schematic cross-sectional views showing a method of manufacturing (or providing) a display apparatus according to an embodiment.
Figure 7B:
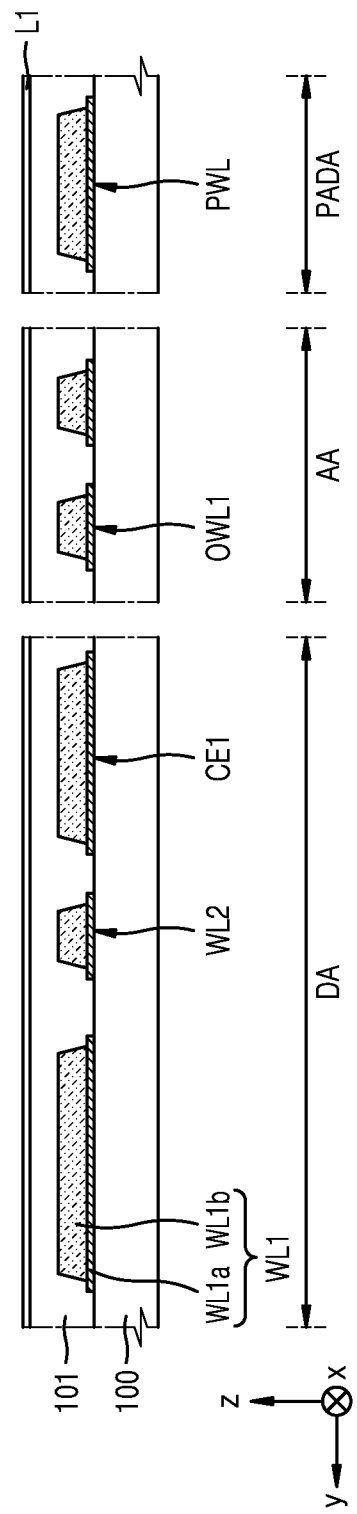
Figure 7C:
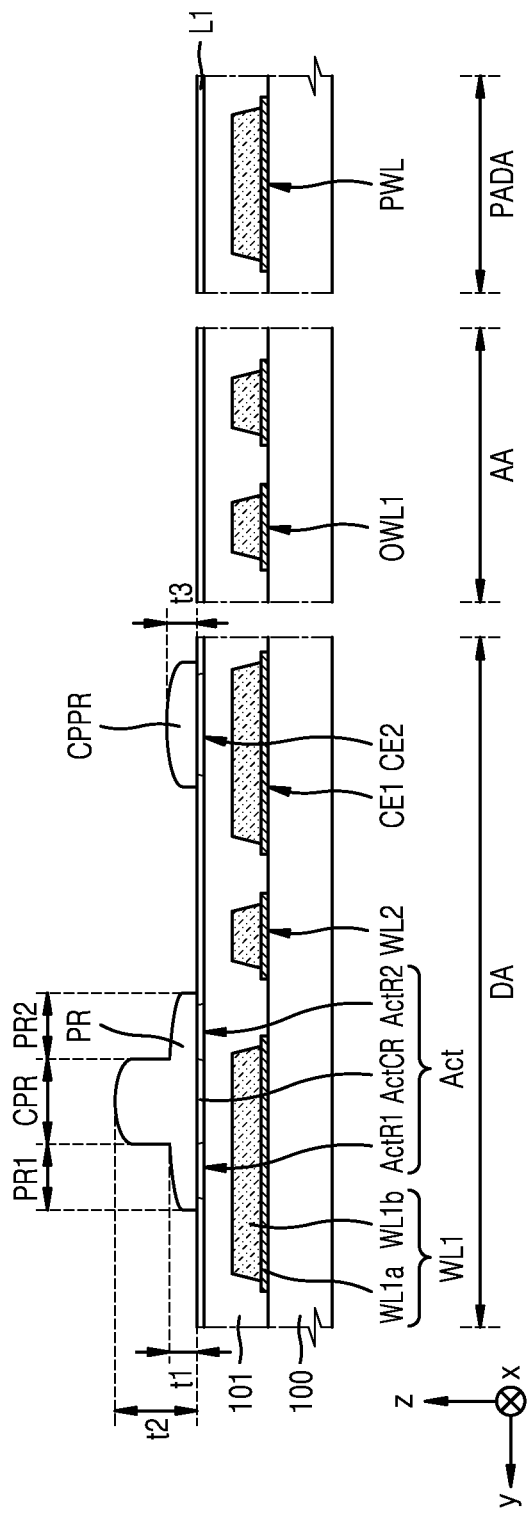
Figure 7D:
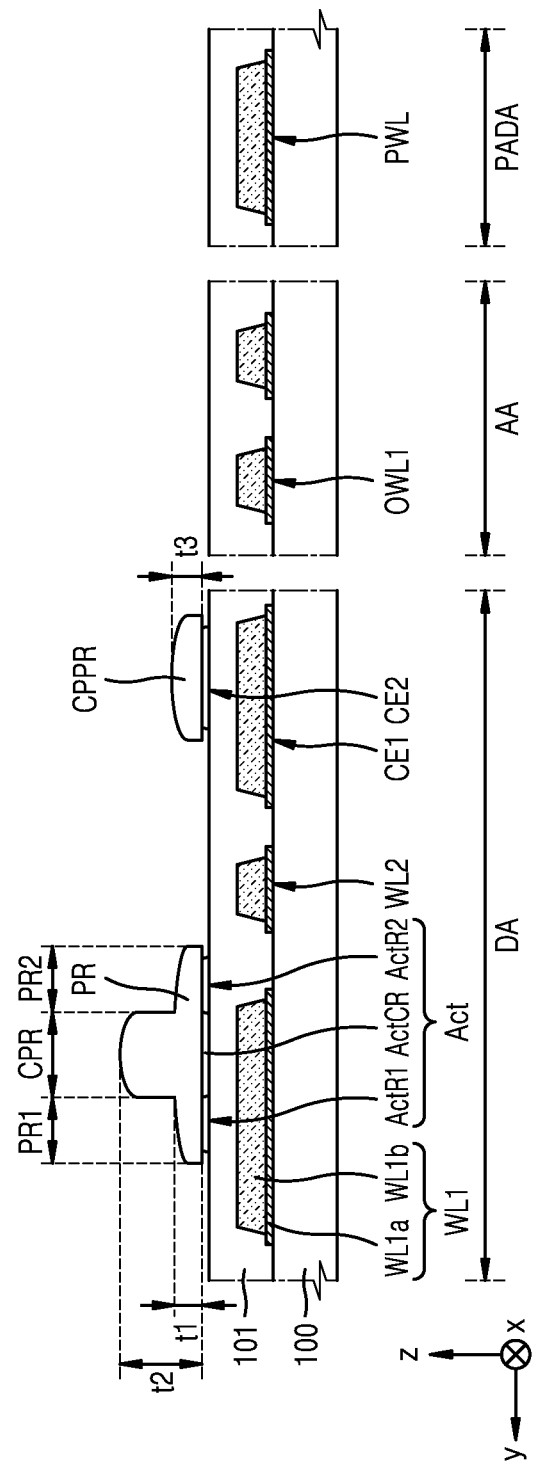
Figure 7E:
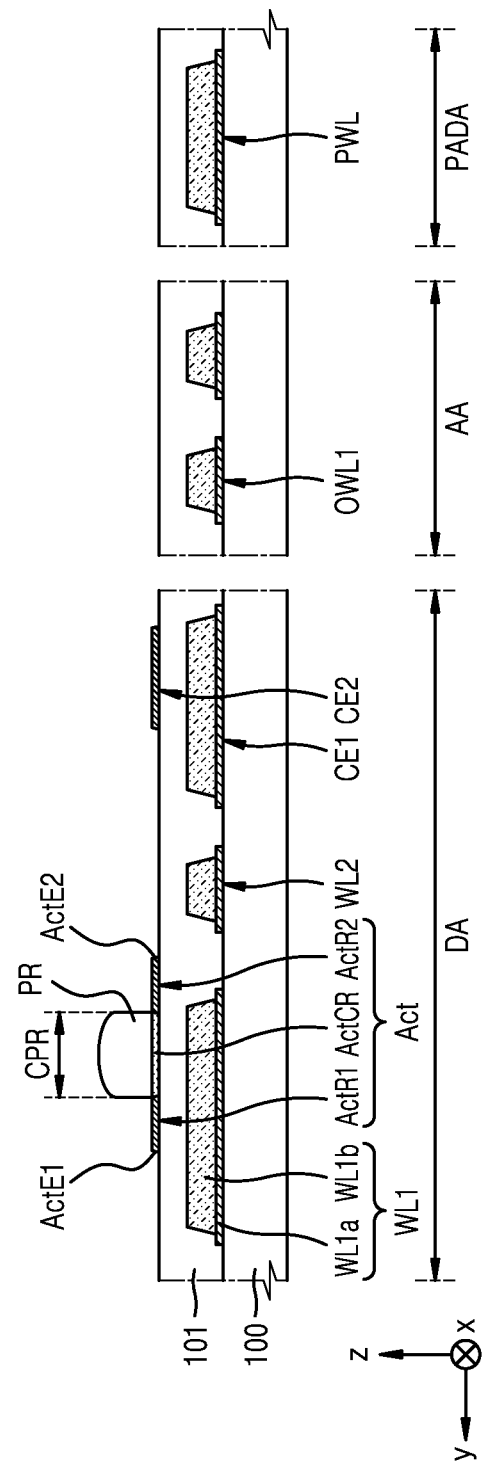
Figure 7F:
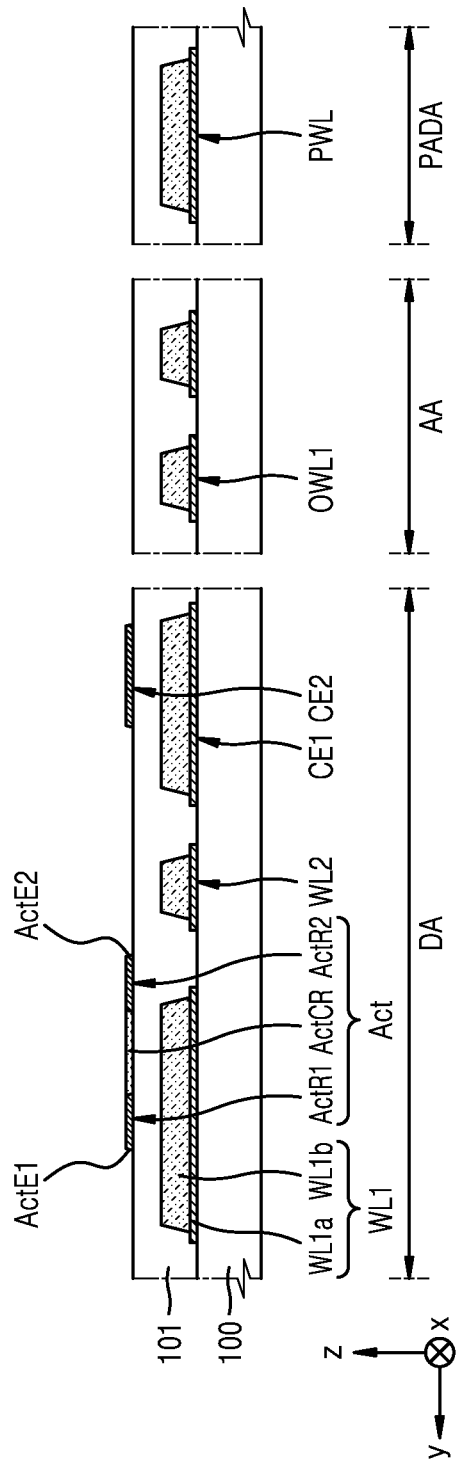
Figure 7G:
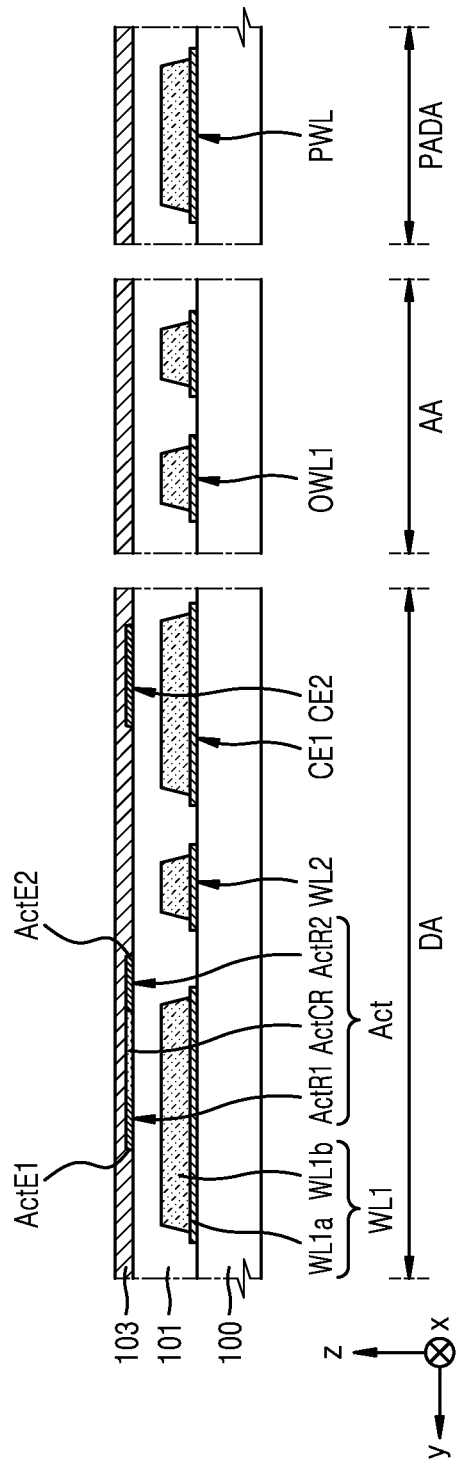
Figure 7H:
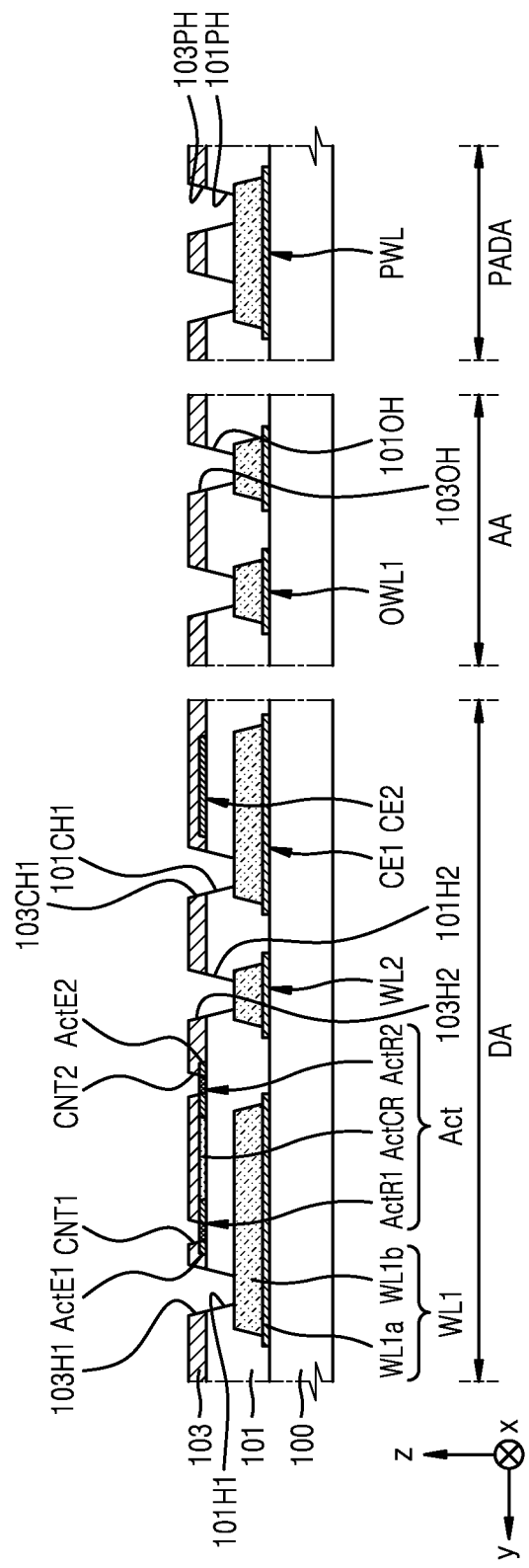
Figure 7I:
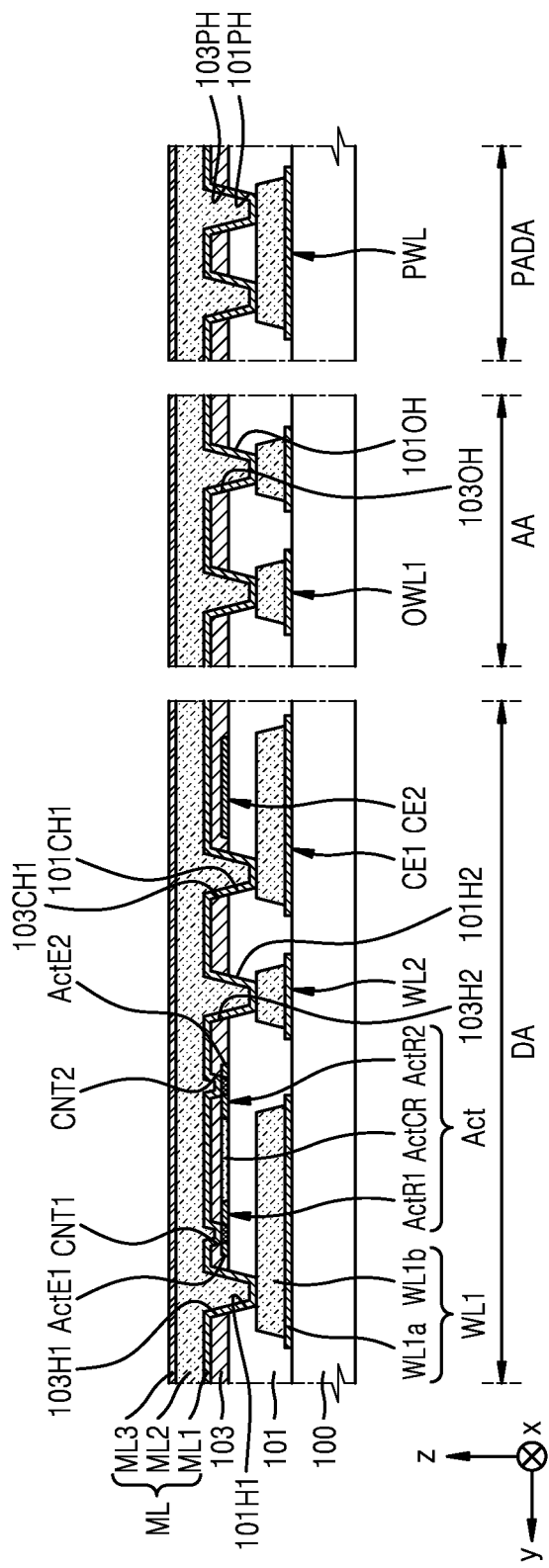
Figure 7J:
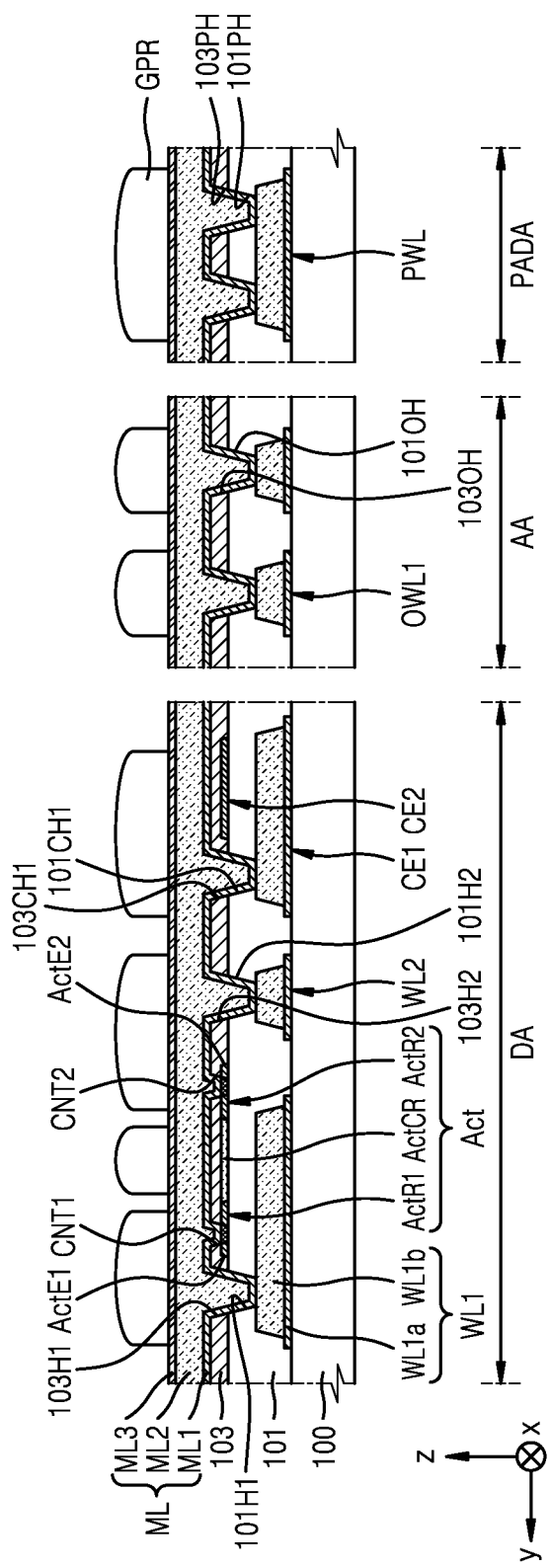
Figure 7K:
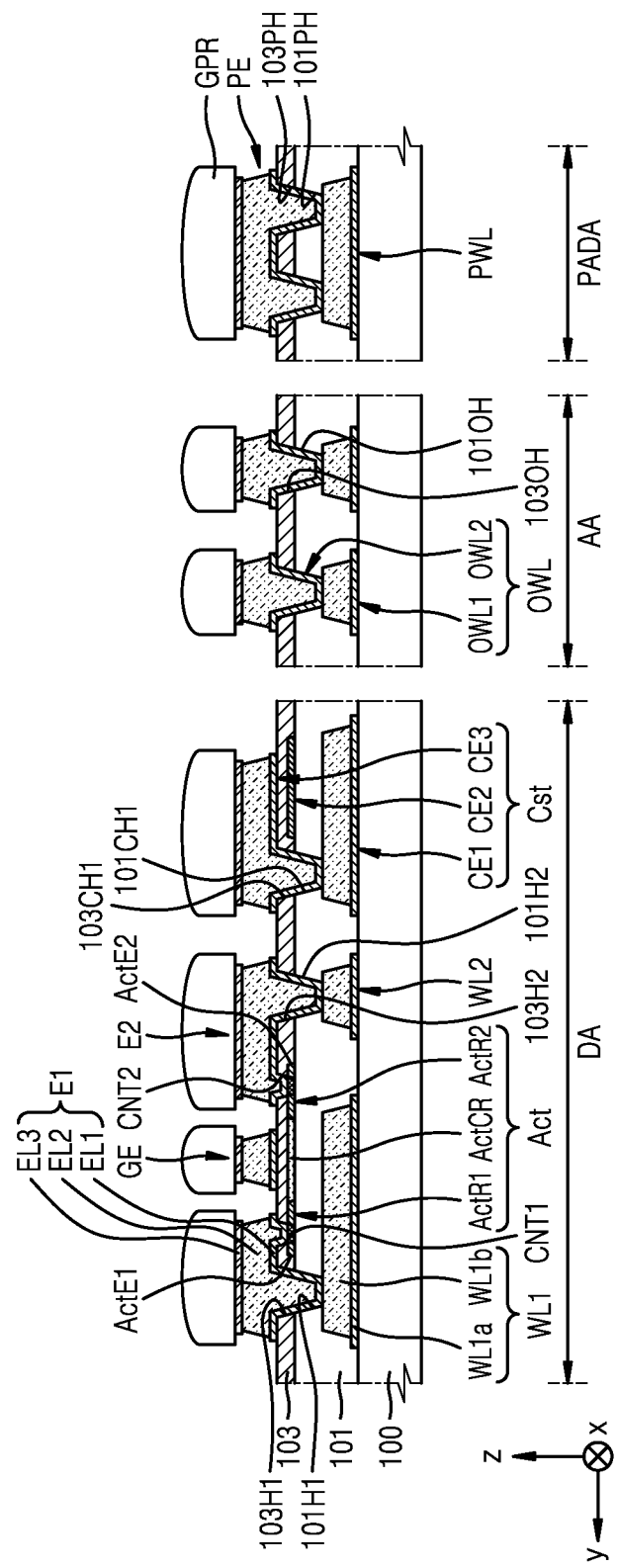
Figure 7L:
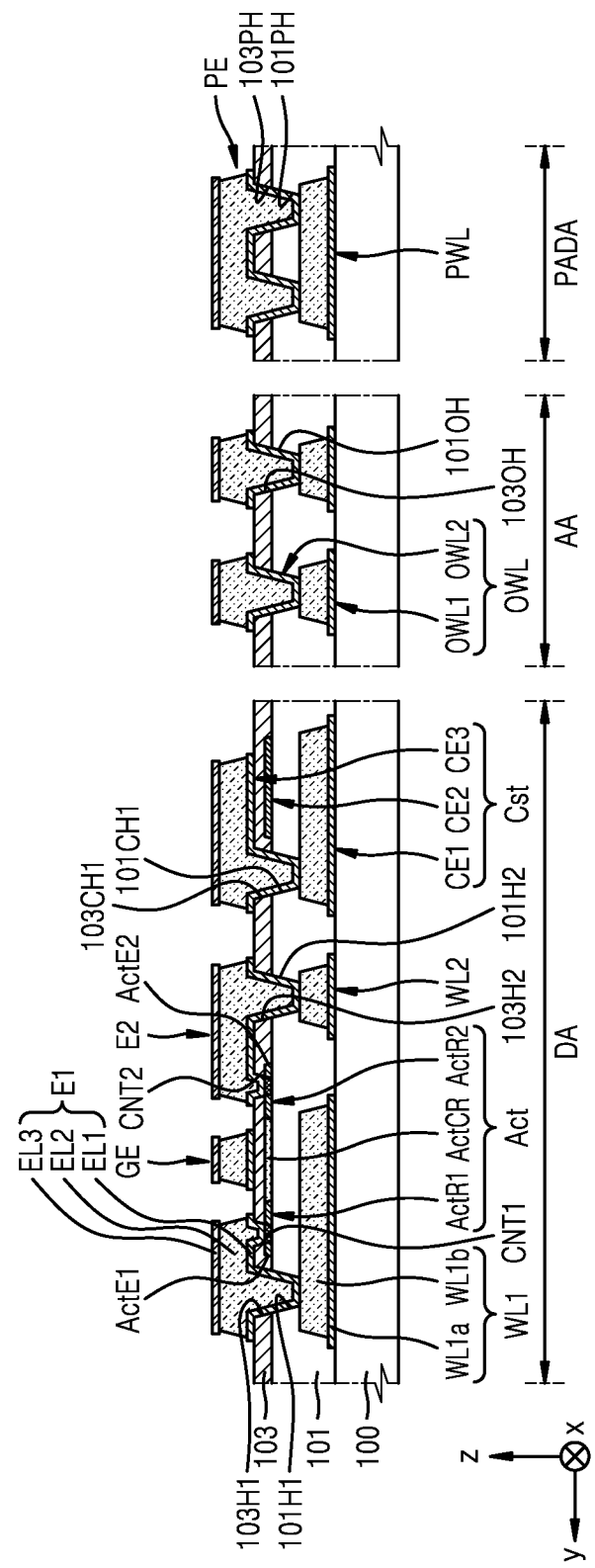
Figure 7M:
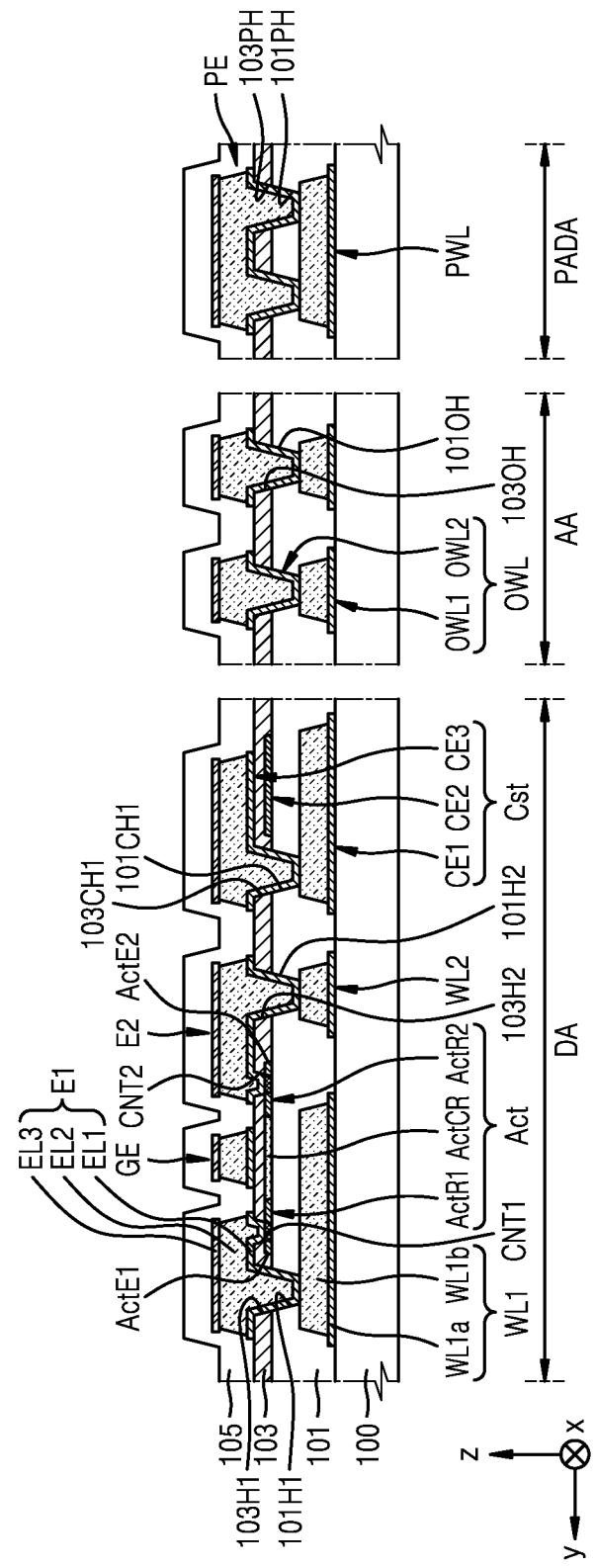
Figure 7N:
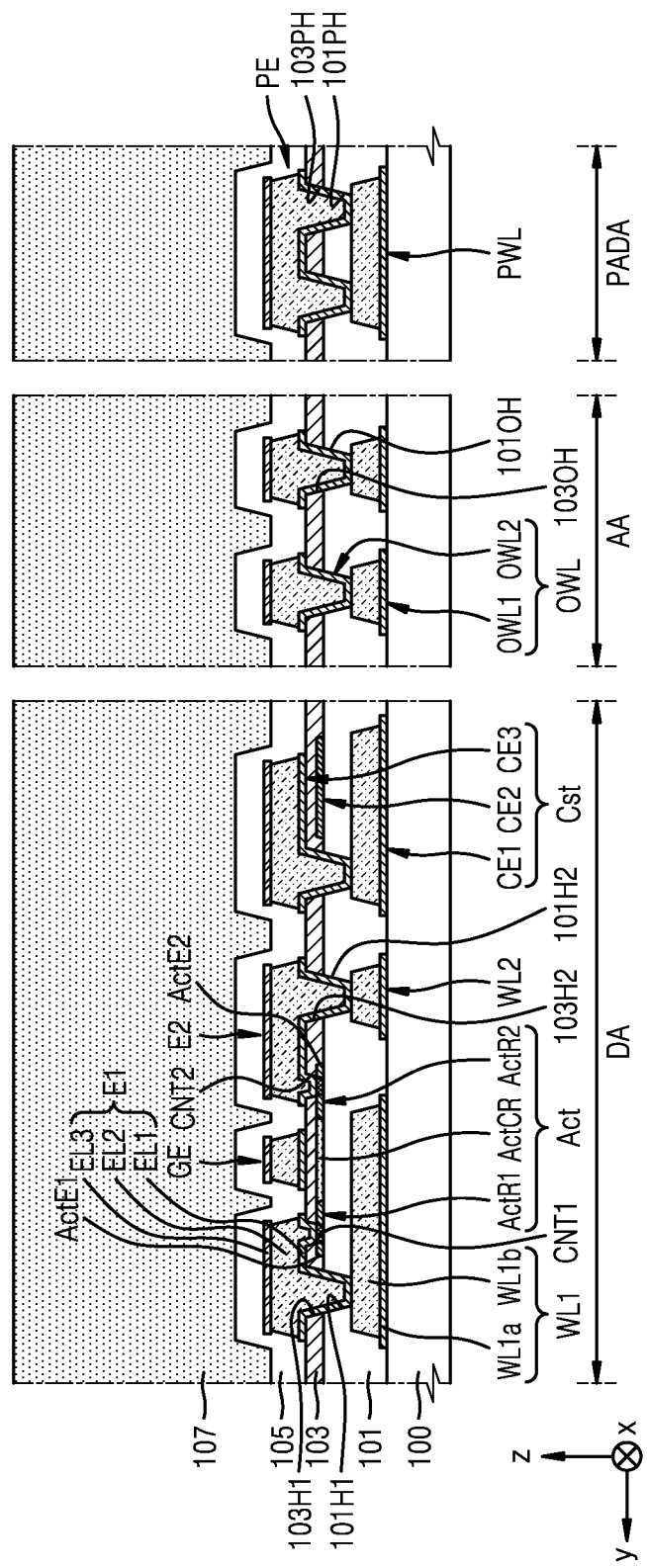
Figure 70:
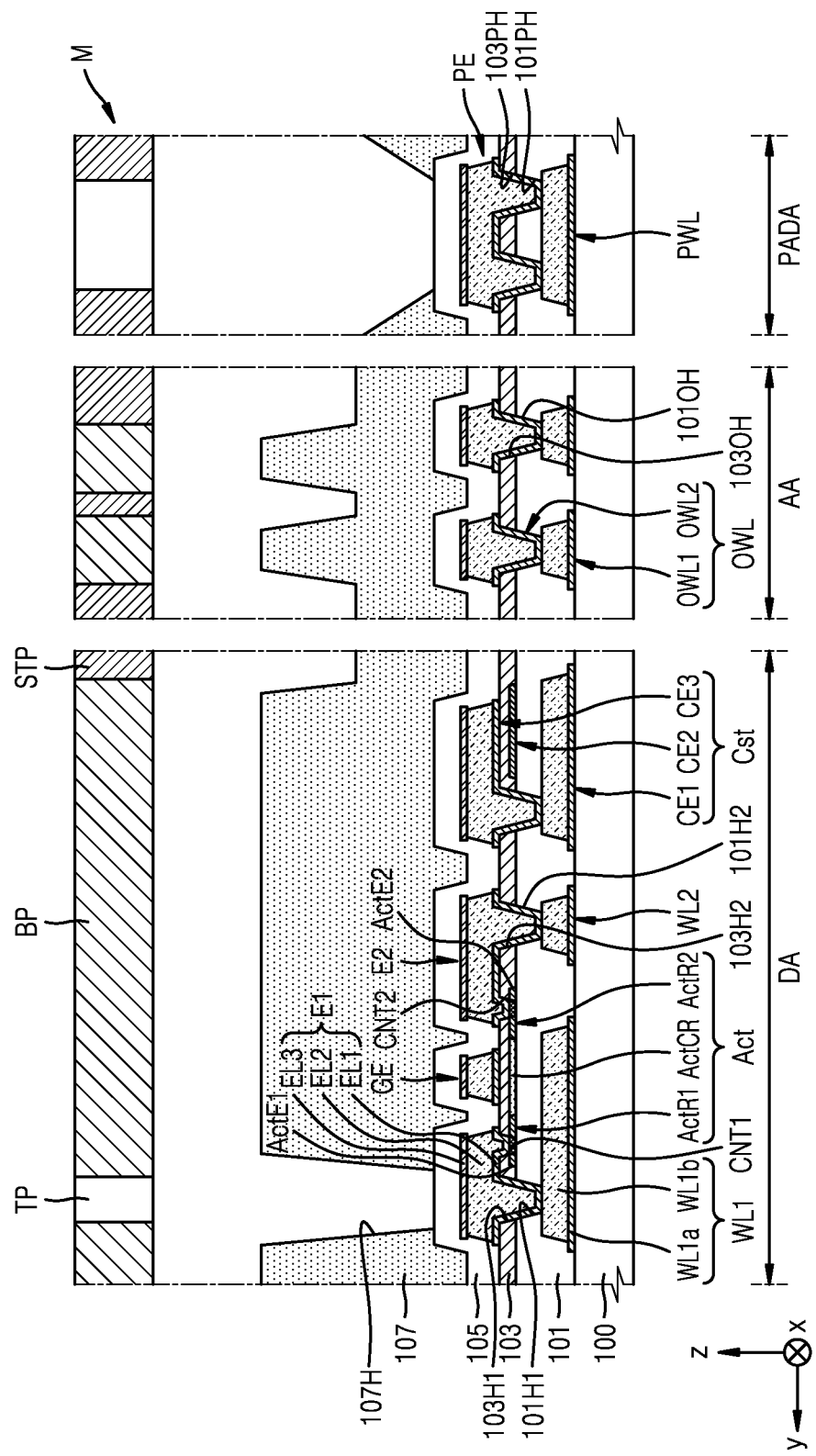
Figure 7P:
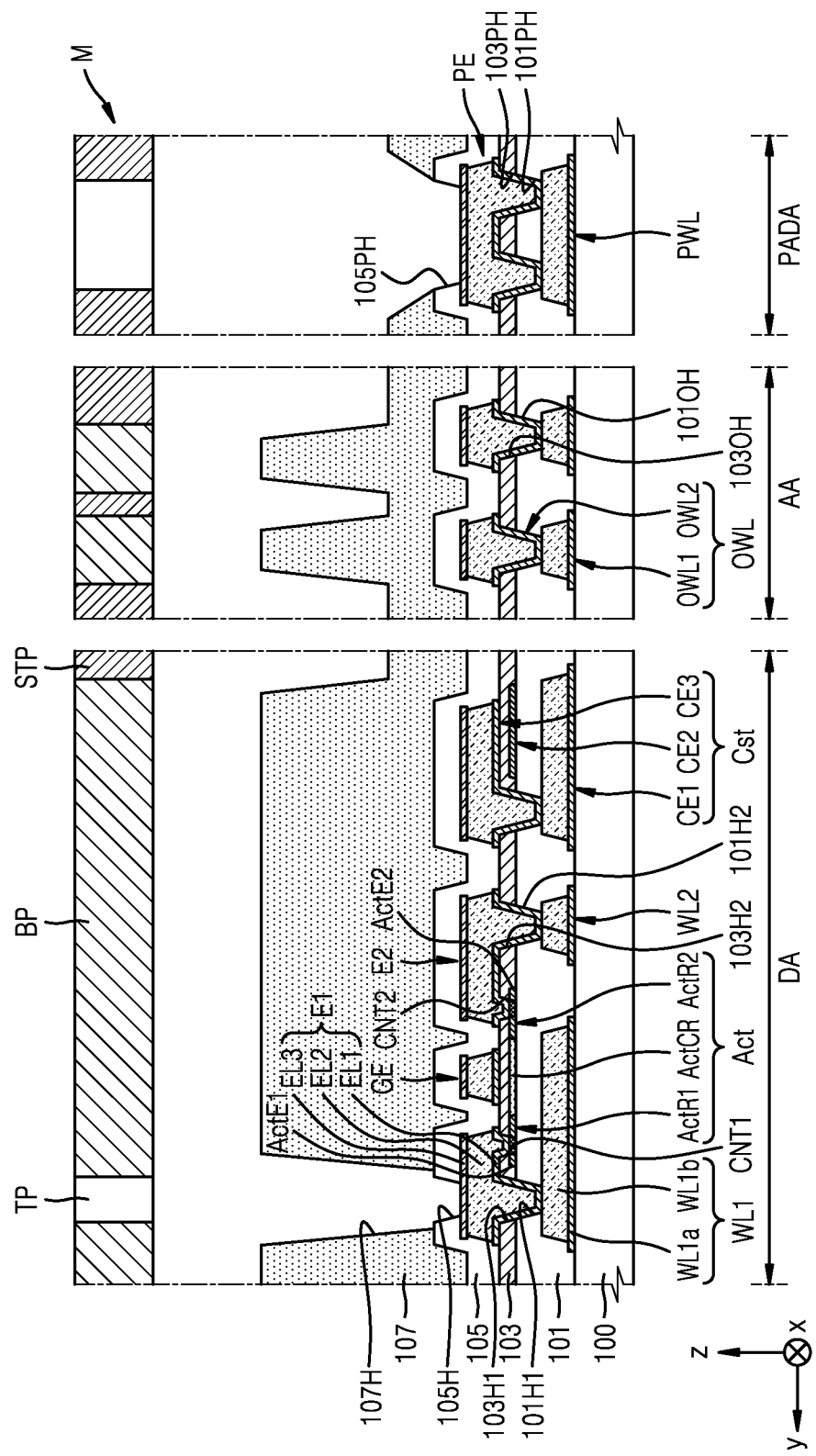
Figure 7Q:
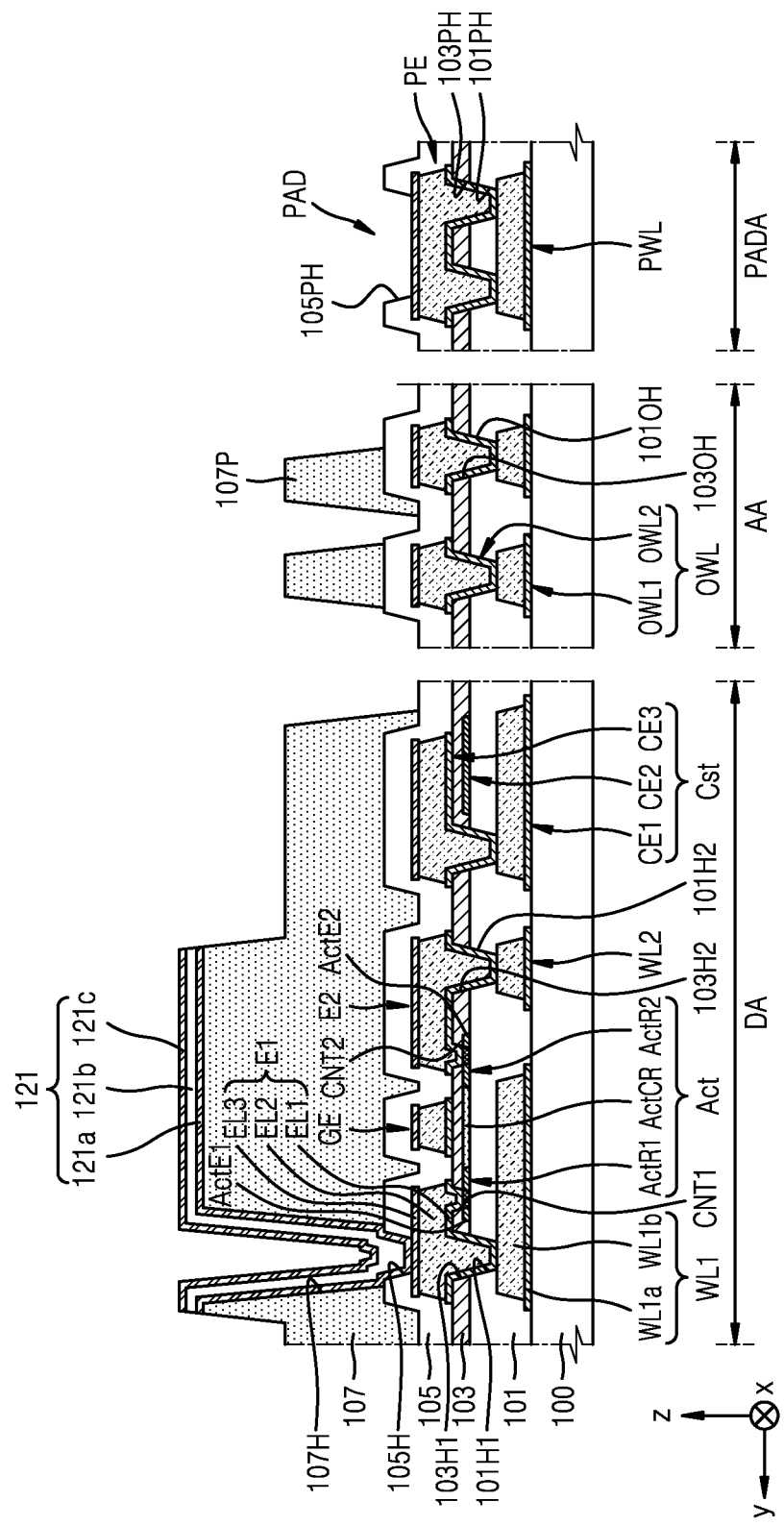
Figure 7R:
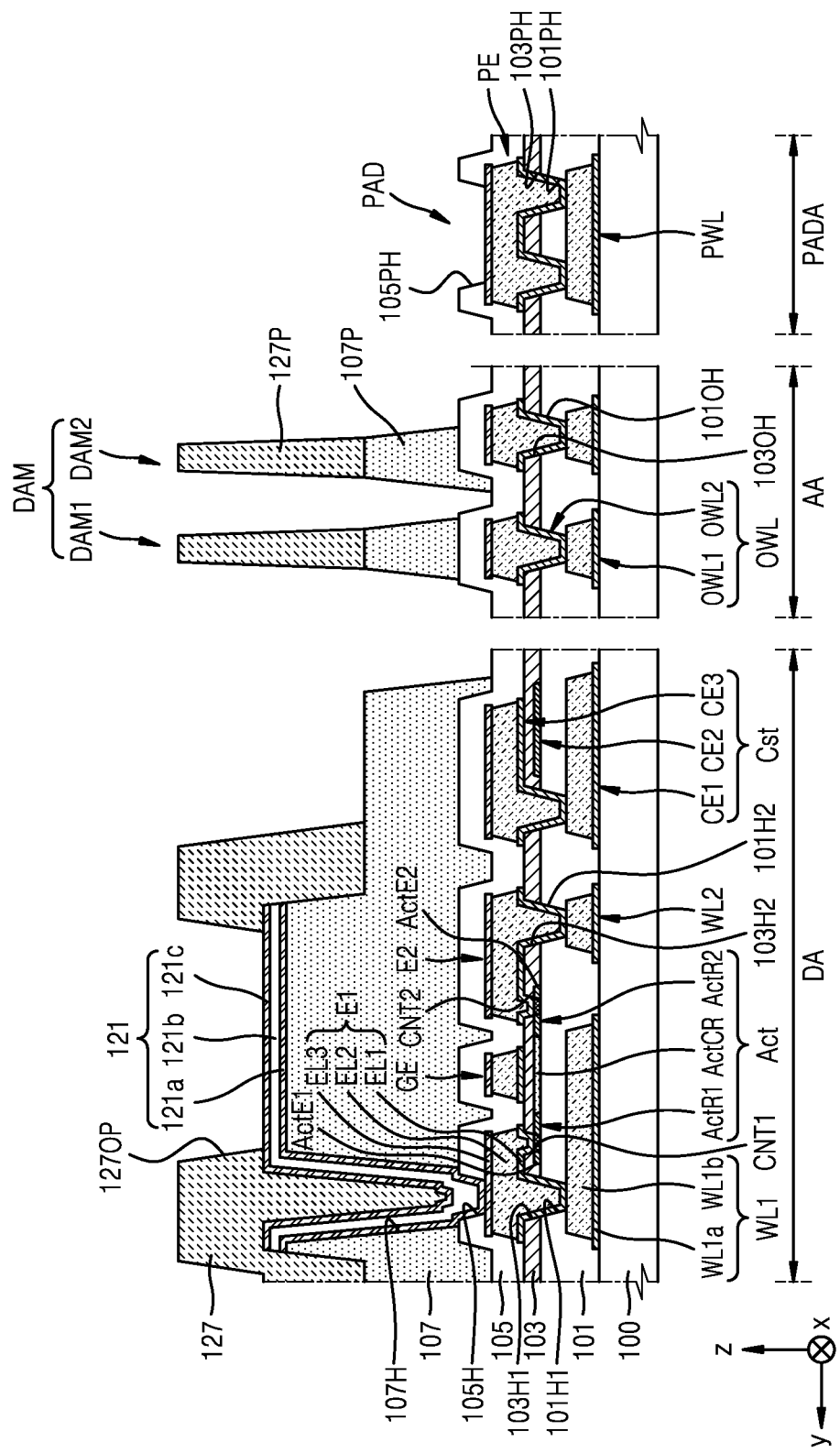

FIGS. 7A to 7R are schematic cross-sectional views showing a method of manufacturing (or providing) a display apparatus 1 according to an embodiment. In FIGS. 7A to 7R, the same reference numerals as those of FIG. 5A denote the same members, and thus, repeated descriptions thereof are omitted.

Referring to FIG. 7A, the substrate 100 may include the display area DA, the adjacent area AA, and the pad area PADA. The first wiring WL1, the second wiring WL2, the first capacitor electrode CE1, the first outer wiring OWL1, and the pad wiring PWL may be formed on the substrate 100. The first wiring WL1, the second wiring WL2, the first capacitor electrode CE1, the first outer wiring OWL1, and the pad wiring PWL may be formed during the same process. The first wiring WL1, the second wiring WL2, the first capacitor electrode CE1, the first outer wiring OWL1, and the pad wiring PWL may include the same material. In the present embodiment, since most of the wirings are arranged on the same layer, the number of masks used in manufacturing the display apparatus 1 may be reduced.

The first wiring WL1, the second wiring WL2, and the first capacitor electrode CE1 may be formed in the display area DA. The first outer wiring OWL1 may be formed in the adjacent area AA. The pad wiring PWL may be formed in the pad area PADA.

Next, the buffer layer 101 may be formed. The buffer layer 101 may cover the first wiring WL1, the second wiring WL2, the first capacitor electrode CE1, the first outer wiring OWL1, and the pad wiring PWL.

In an embodiment, the first wiring WL1, the second wiring WL2, the first capacitor electrode CE1, the first outer wiring OWL1, the pad wiring PWL, and the buffer layer 101 may be formed before the semiconductor layer is formed.

Referring to FIGS. 7B to 7F, the semiconductor layer Act and the second capacitor electrode CE2 each including an oxide semiconductor may be formed. The semiconductor layer Act and the second capacitor electrode CE2 may be formed on the buffer layer 101. In an embodiment, the semiconductor layer Act and the second capacitor electrode CE2 may be formed over the substrate 100.

The semiconductor layer Act may include the channel region ActCR, the first region ActR1, and the second region ActR2. The channel region ActCR may be arranged between the first region ActR1 and the second region ActR2. The first region ActR1 and the second region ActR2 may each extend from the channel region ActCR to an edge ActE of the semiconductor layer Act. The first region ActR1 may extend from the channel region ActCR to the first edge ActE1 of the semiconductor layer Act. The second region ActR2 may extend from the channel region ActCR to the second edge ActE2 of the semiconductor layer Act. The first region ActR1 and the second region ActR2 are regions having a lower resistance than that of the channel region ActCR and may correspond to a source region or a drain region. In an embodiment, the first region ActR1 and the second region ActR2 may be doped with impurities. The first region ActR1 and the second region ActR2 may be doped regions. The second capacitor electrode CE2 may have a lower resistance than that of the channel region ActCR. Impurities may be added to the second capacitor electrode CE2. The second capacitor electrode CE2 may be doped. Accordingly, the second capacitor electrode CE2 may serve as an electrode plate of the storage capacitor Cst.

Referring to FIG. 7B, a first layer L1 including an oxide semiconductor may be formed. The first layer L1 may be formed on the buffer layer 101. In an embodiment, the first layer L1 may be formed in the display area DA, the adjacent area AA, and the pad area PADA. In an embodiment, the first layer L1 may not be formed in the adjacent area AA and the pad area PADA. The first layer L1 may include Zn-oxide-based material and include Zn-oxide, In—Zn oxide, and Ga—In—Zn oxide. Alternatively, the first layer L1 may include In—Ga—Zn—O (IGZO), In—Sn—Zn—O (ITZO), or In—Ga—Sn—Zn—O (IGTZO) semiconductor containing metal such as indium (In), gallium (Ga), and stannum (Sn) in ZnO.

Referring to FIG. 7C, a photoresist PR and a capacitor photoresist CPPR may be formed. The photoresist PR and the capacitor photoresist CPPR may be formed on the first layer L1. The photoresist PR and the capacitor photoresist CPPR may be formed by coating a photoresist layer (e.g., first photoresist layer) and performing an exposure and developing process. A half-tone mask or a slit mask may be used when exposing the photoresist layer.

The photoresist PR may overlap (or correspond to) a region of the first layer L1 that is to be the semiconductor layer Act. The photoresist PR may include a channel photoresist region CPR, a first photoresist region PR1, and a second photoresist region PR2. The channel photoresist region CPR may overlap a region of the first layer L1 that is to be the channel region ActCR of the semiconductor layer Act. The first photoresist region PR1 may overlap a region of the first layer L1 that is to be the first region ActR1 of the semiconductor layer Act. The second photoresist region PR2 may overlap a region of the first layer L1 that is to be the second region ActR2 of the semiconductor layer Act. Since the second photoresist region PR2 similar to the first photoresist region PR1, the first photoresist region PR1 is mainly described in detail.

The photoresist PR at the first photoresist region PR1 may have a first thickness t1, and at the channel photoresist region CPR may have a second thickness t2. The first thickness t1 may be a maximum distance from the lower surface of the photoresist PR facing the first layer L1 in the first photoresist region PR1, to the upper surface of the photoresist PR opposite the lower surface of the photoresist PR. The second thickness t2 may be a maximum distance from the lower surface of the photoresist PR in the channel photoresist region CPR to the upper surface of the photoresist PR. The second thickness t2 may be greater than the first thickness t1. A lower surface may be closest to the substrate 100, while an upper surface may be furthest from the substrate 100.

The capacitor photoresist CPPR may overlap a region of the first layer L1 that is to be the second capacitor electrode CE2. The capacitor photoresist CPPR may have a third thickness t3. The third thickness t3 may be a maximum distance from the lower surface of the capacitor photoresist CPPR facing the first layer L1 to the upper surface of the capacitor photoresist CPPR opposite the lower surface of the photoresist PR. The third thickness t3 may be less than the second thickness t2.

Referring to FIG. 7D, the first layer L1 may be etched. In an embodiment, the first layer may be wet-etched. A portion of the first layer L1 that overlaps the photoresist PR may not be etched and may become the semiconductor layer Act. A portion of the first layer L1 that overlaps the capacitor photoresist CPPR may not be etched and may become the second capacitor electrode CE2. In an embodiment, the second capacitor electrode CE2 may overlap the first capacitor electrode CE1. In an embodiment, the first layer L1 may be over-etched. Accordingly, a portion of the first layer L1 that overlaps the photoresist PR may be at least partially removed. A portion of the first layer L1 that overlaps the capacitor photoresist CPPR may be at least partially removed.

Referring to FIG. 7E, the photoresist PR and the capacitor photoresist CPPR may be etched. The photoresist PR and the capacitor photoresist CPPR may be dry-etched. As an example, the photoresist PR and the capacitor photoresist CPPR may be ashed. As another example, the photoresist PR and the capacitor photoresist CPPR may be plasma-treated. In this case, the thickness of the photoresist PR may be reduced from original thicknesses thereof. Since the original thickness of the first photoresist region PR1 is less than the original thickness of the channel photoresist CPR, the first photoresist region PR1 may be removed from the stacked structure. Since the original thickness of the capacitor photoresist CPPR is less than the original thickness of the channel photoresist region CPR, the capacitor photoresist CPPR may be removed.

When the photoresist PR and the capacitor photoresist CPPR are etched, the first region ActR1, the second region ActR2, and the second capacitor electrode CE2 may be exposed to outside a remaining portion of the photoresist layer (e.g., the channel photoresist region CPR). In an embodiment, when the photoresist PR and the capacitor photoresist CPPR are etched, the first region ActR1, the second region ActR2, and the second capacitor electrode CE2 which are exposed, may be doped (e.g., first doping). As an example, impurities may be added to the first region ActR1, the second region ActR2, and the second capacitor electrode CE2. Accordingly, the first region ActR1 and the second region ActR2 may each have a lower resistance than that of the channel region ActCR. The second capacitor electrode CE2 may have a lower resistance than that of the channel region ActCR and serve as an electrode plate.

Since the first edge ActE1 of the semiconductor layer Act is exposed without overlapping the photoresist PR, the first region ActR1 may extend from the channel region ActCR to the first edge ActE1. Since the second edge ActE2 of the semiconductor layer Act is exposed without overlapping the photoresist PR, the second region ActR2 may extend from the channel region ActCR to the second edge ActE2.

Referring to FIG. 7F, the remaining portion of the photoresist PR may be stripped. In the present embodiment, the first region ActR1, the second region ActR2, and the second capacitor electrode CE2 may each be doped while the semiconductor layer Act and the second capacitor electrode CE2 are formed. Accordingly, the first region ActR1, the second region ActR2, and the second capacitor electrode CE2 may be doped and may have a low resistance regardless of a subsequent process. In addition, since the first region ActR1, the second region ActR2, and the second capacitor electrode CE2 do not need doping during a subsequent process, the degree of freedom of the subsequent process may be increased.

Referring to FIG. 7G, the first inorganic insulating layer 103 may be formed. The first inorganic insulating layer 103 may be formed by chemical vapor deposition. The first inorganic insulating layer 103 may be formed in the display area DA, the adjacent area AA, and the pad area PADA. The first inorganic insulating layer 103 may continuously extend. The first inorganic insulating layer 103 may cover the first edge ActE1 of the semiconductor layer Act. The first inorganic insulating layer 103 may cover the second edge ActE2 of the semiconductor layer Act. In an embodiment, the first inorganic insulating layer 103 may cover the semiconductor layer Act and the second capacitor electrode CE2. The first inorganic insulating layer 103 may cover the first region ActR1, the channel region ActCR, and the second region ActR2.

In an embodiment, the first inorganic insulating layer 103 may include silicon oxide ($SiO_2$). In this case, the first inorganic insulating layer 103 may prevent or reduce external materials from penetrating to the semiconductor layer Act and the second capacitor electrode CE2.

Referring to FIG. 7H, the first contact hole CNT1, the second contact hole CNT2, the first hole 103H1, the second hole 103H2, the first inorganic insulating layer connection hole 103CH1, the second outer hole 103OH, and the second pad hole 103PH may be formed in the first inorganic insulating layer 103. In addition, the first buffer layer hole 101H1, the second buffer layer hole 101H2, the first buffer layer connection hole 101CH1, the first outer hole 101OH, and the first pad hole 101PH may be formed in the buffer layer 101. The first buffer layer hole 101H1 may overlap the first wiring WL1 and expose the first wiring WL1. The second buffer layer hole 101H2 may overlap the second wiring WL2 and expose the second wiring WL2. The first buffer layer connection hole 101CH1 may overlap and expose the first capacitor electrode CE1. The first outer hole 101OH may overlap the first outer wiring OWL1 and expose the first outer wiring OWL1. In an embodiment, the first outer hole 101OH may be provided in plurality. The first pad hole 101PH may overlap the pad wiring PWL and expose the pad wiring PWL. The first contact hole CNT1 may overlap and expose the first region ActR1. The second contact hole CNT2 may overlap and expose the second region ActR2. The first hole 103H1 may overlap and be connected to the first buffer layer hole 101H1. The second hole 103H2 may overlap and be connected to the second buffer layer hole 101H2. The first inorganic insulating layer connection hole 103CH1 may overlap and be connected to the first buffer layer hole 101H1. The second outer hole 103OH may overlap and be connected to the first outer hole 101OH. The second pad hole 103PH may overlap and be connected to the first pad hole 101PH.

In an embodiment, the first region ActR1 overlapping the first contact hole CNT1 and the second region ActR2 overlapping the second contact hole CNT2 may be additionally doped (e.g., second doping) via the first contact hole CNT1 and the second contact hole CNT2.

The first inorganic insulating layer 103 may continuously extend between holes adjacent to each other. As an example, the first inorganic insulating layer 103 may continuously extend between the first contact hole CNT1 and the second contact hole CNT2. Accordingly, the first inorganic insulating layer 103 may overlap the first region ActR1, the channel region ActCR, and the second region ActR2 of the semiconductor layer Act.

Referring to FIGS. 7I to 7L, the first electrode E1, the second electrode E2, the third capacitor electrode CE3, the second outer wiring OWL2, and the pad electrode PE may be formed.

Referring to FIG. 7I, a metal layer ML may be formed. The metal layer ML may be formed in an entirety of the display area DA, the adjacent area AA, and the pad area PADA. The metal layer ML may include a conductive material including molybdenum (Mo), aluminum (Al), copper (Cu), and titanium (Ti) and have a single-layered structure or a multi-layered structure including the above materials. In an embodiment, the metal layer ML may include a transparent conductive material. The metal layer ML may include a conductive oxide such as indium tin oxide (ITO), indium zinc oxide (IZO), ZnO, indium oxide ($In_2O_3$), indium gallium oxide (IGO), or aluminum zinc oxide (AZO). In an embodiment, the metal layer ML may include a first metal layer ML1, a second metal layer ML2, and a third metal layer ML3. The first metal layer ML1 may include titanium (Ti). The second metal layer ML2 may be arranged on the first metal layer ML1. The second metal layer ML2 may include copper (Cu). The third metal layer ML3 may be arranged on the second metal layer ML2. The third metal layer ML3 may include indium tin oxide. In an embodiment, the third metal layer ML3 may be omitted.

Referring to FIG. 7J, a gate photoresist GPR may be formed. The gate photoresist GPR may be provided in plurality as photoresist patterns. The plurality of gate photoresists GPR may overlap regions of the metal layer ML that are to be the first electrode E1, the second electrode E2, the gate electrode GE, the third capacitor electrode CE3, the second outer wiring OWL2, and the pad electrode PE. The gate photoresist GPR may be formed by coating a photoresist layer (e.g., second photoresist layer) and performing an exposure and developing process.

Referring to FIG. 7K, the metal layer ML may be etched. In an embodiment, the metal layer ML may be wet-etched. Portions of the metal layer ML that overlap the gate photoresist GPR may not be etched and become the first electrode E1, the second electrode E2, the third capacitor electrode CE3, and the second outer wiring OWL2, and the pad electrode PE. In an embodiment, a portion of the metal layer ML that overlaps the edges the gate photoresist GPR may be at least partially removed. In other words, the metal layer ML may be overetched to have a dimension (e.g., width) smaller than a dimension of the gate photo resist, along a same direction.

The first electrode E1 may overlap the first region ActR1 and be electrically connected to the first region ActR1 through the first contact hole CNT1. The second electrode E2 may overlap the second region ActR2 and be electrically connected to the second region ActR2 through the second contact hole CNT2. In an embodiment, the first electrode E1 may overlap the first contact hole CNT1 entirely, in a plan view. The second electrode E2 may overlap the second contact hole CNT2, entirely in a plan view. The gate electrode GE may overlap the channel region ActCR. The third capacitor electrode CE3 may overlap the second capacitor electrode CE2. In an embodiment, the third capacitor electrode CE3 may be connected to the first capacitor electrode CE1 through the first buffer layer connection hole 101CH1 and the first inorganic insulating layer connection hole 103CH1. The second outer wiring OWL2 may be arranged in the adjacent area AA. In an embodiment, the second outer wiring OWL2 may be provided in plurality. In an embodiment, the second outer wiring OWL2 may be connected to the first outer wiring OWL1 through the first outer hole 101OH and the second outer hole 103OH. The pad electrode PE may be arranged in the pad area PADA. The pad electrode PE may be connected to the pad wiring PWL through the first pad hole 101PH the second pad hole 103PH.

In the present embodiment, a conventional process of separating the first inorganic insulating layer 103 into a plurality of patterns may be omitted. In other words, a process of additionally etching the first inorganic insulating layer 103 in the presence of the gate photoresist GPR, may be omitted. The process of separating the first inorganic insulating layer 103 into a plurality of patterns may be a process of removing at least a portion of the first inorganic insulating layer 103 to dope the first region ActR1, the second region ActR2, and the second capacitor electrode CE2 in the subsequent process. However, in the case where the first inorganic insulating layer 103 is separated into the plurality of patterns, and the semiconductor layer Act and/or the second capacitor electrode CE2 are exposed for doping to outside the first inorganic insulating layer 103 thereby, the semiconductor layer Act and/or the second capacitor electrode CE2 may be damaged from the separation process.

In one or more embodiment, since providing of the semiconductor layer Act and the second capacitor electrode CE2 includes doping of the first region ActR1, the second region ActR2, and the second capacitor electrode CE2 before exposure of these features to outside the first inorganic insulating layer 103 during separation of the first inorganic insulating layer 103 into a plurality of patterns, the process of separating the first inorganic insulating layer 103 into a plurality of patterns may be omitted. Accordingly, the semiconductor layer Act except the regions overlapping the first contact hole CNT1 and the second contact hole CNT2 may not be exposed. In this case, a damage to the semiconductor layer Act and the second capacitor electrode CE2 may be prevented or reduced.

Referring to FIG. 7L, the gate photoresist GPR may be stripped. Since the first inorganic insulating layer 103 is not provided as a plurality of patterns and continuously extends in the present embodiment, the semiconductor layer Act and the second capacitor electrode CE2 under the first inorganic insulating layer 103 may not be damaged during processes thereafter. Accordingly, the reliability of the display apparatus 1 having the doped patterns of the semiconductor layer Act and the second capacitor electrode CE2 under the first inorganic insulating layer 103 may be improved.

Referring to FIG. 7M, the second inorganic insulating layer 105 may be formed. The second inorganic insulating layer 105 may be formed by chemical vapor deposition. The second inorganic insulating layer 105 may cover the first electrode E1, the second electrode E2, the gate electrode GE, the second outer wiring OWL2, and the pad electrode PE. In an embodiment, the second inorganic insulating layer 105 may continuously extend.

Referring to FIG. 7N, the organic insulating layer 107 may be formed. The organic insulating layer 107 may be formed on the second inorganic insulating layer 105. The organic insulating layer 107 may be formed in the display area DA, the adjacent area AA, and the pad area PADA entirely.

Referring to FIG. 7O, the organic insulating layer hole 107H may be formed. First, a mask M may be arranged on the organic insulating layer 107. In an embodiment, the mask M may be a half-tone mask. The mask M may include a light-blocking portion BP, a semi-transmissive portion STP, and a transmission portion TP. The light-blocking portion BP may block most of light irradiated to the layers underlying the mask M. The semi-transmissive portion STP may transmit a portion of light. A light transmittance of the semi-transmissive portion STP may be greater than a light transmittance of the light-blocking portion BP. The transmission portion TP may transmit a portion of light. A light transmittance of the transmission portion TP may be greater than a light transmittance of the semi-transmissive portion STP.

In an embodiment, the light-blocking portion BP, the semi-transmissive portion STP, and the transmission portion TP may overlap the display area DA. In an embodiment, the transmission portion TP may overlap one of the first electrode E1 and the second electrode E2.

In an embodiment, the light-blocking portion BP and the semi-transmissive portion STP may overlap the adjacent area AA. The light-blocking portion BP and the semi-transmissive portion STP may be provided in plurality. The plurality of light-blocking portions BP and the plurality of semi-transmissive portions STP may be alternately arranged.

In an embodiment, the transmission portion TP and the semi-transmissive portion STP may overlap the pad area PADA. The transmission portion TP may overlap the pad electrode PE.

Next, the organic insulating layer 107 may be exposed and developed. In an embodiment, the organic insulating layer hole 107H overlapping one of the first electrode E1 and the second electrode E2 may be formed. In an embodiment, thickness portions of the organic insulating layer 107 may be removed from the adjacent area AA, and thus, a plurality of protrusions may be formed as remaining thickness portions. In an embodiment, a portion of the organic insulating layer 107 that overlaps the pad electrode PE may be completely removed.

Referring to FIG. 7P, the second inorganic insulating layer 105 is etched, and thus, the lower hole 105H and the third pad hole 105PH may be formed. The lower hole 105H may overlap the organic insulating layer hole 107H. The lower hole 105H may overlap one of the first electrode E1 and the second electrode E2, and expose one of the first electrode E1 and the second electrode E2. The third pad hole 105PH may overlap and expose the pad electrode PE. In an embodiment, while the second inorganic insulating layer 105 is etched, a portion of the organic insulating layer 107 may be etched.

The organic insulating layer hole 107H and the lower hole 105H may each be formed by using the same mask M. Accordingly, the number of masks used in forming the display apparatus 1 may be reduced.

Referring to FIG. 7Q, the pixel electrode 121 may be formed. The pixel electrode 121 may overlap the organic insulating layer hole 107H. The pixel electrode 121 may be electrically connected to one of the first electrode E1 and the second electrode E2 through the lower hole 105H and the organic insulating layer hole 107H. In an embodiment, a wet-etching process and/or a dry-etching process may be used when forming the pixel electrode 121. In this case, a portion of the organic insulating layer 107 arranged in the display area DA may be removed. A portion of the organic insulating layer 107 arranged in the adjacent area AA may be removed. In this case, the first insulating pattern 107P may be separated from the organic insulating layer 107. In an embodiment, the first insulating pattern 107P may be provided in plurality. In an embodiment, the organic insulating layer 107 arranged in the pad area PADA may be removed.

Referring to FIG. 7R, the pixel-defining layer 127 and the second insulating pattern 127P may be formed. The pixel-defining layer 127 may include the pixel opening 1270P overlapping the pixel electrode 121 and cover the edges of the pixel electrode 121.

The second insulating pattern 127P may be formed in the adjacent area AA. In an embodiment, the second insulating pattern 127P may be formed on the first insulating pattern 107P. The second insulating pattern 127P may include the same material as that of the pixel-defining layer 127. The second insulating pattern 127P and the pixel-defining layer 127 may be formed during the same process. The first insulating pattern 107P and the second insulating pattern 127P may together constitute the dam DAM. In an embodiment, the dam DAM may include the first dam DAM1 and the second dam DAM2.

Since the display apparatus 1 according to an embodiment has a relatively simple stacked structure as described above, the display apparatus 1 may be manufactured by using a small number of masks.

Figure 8:
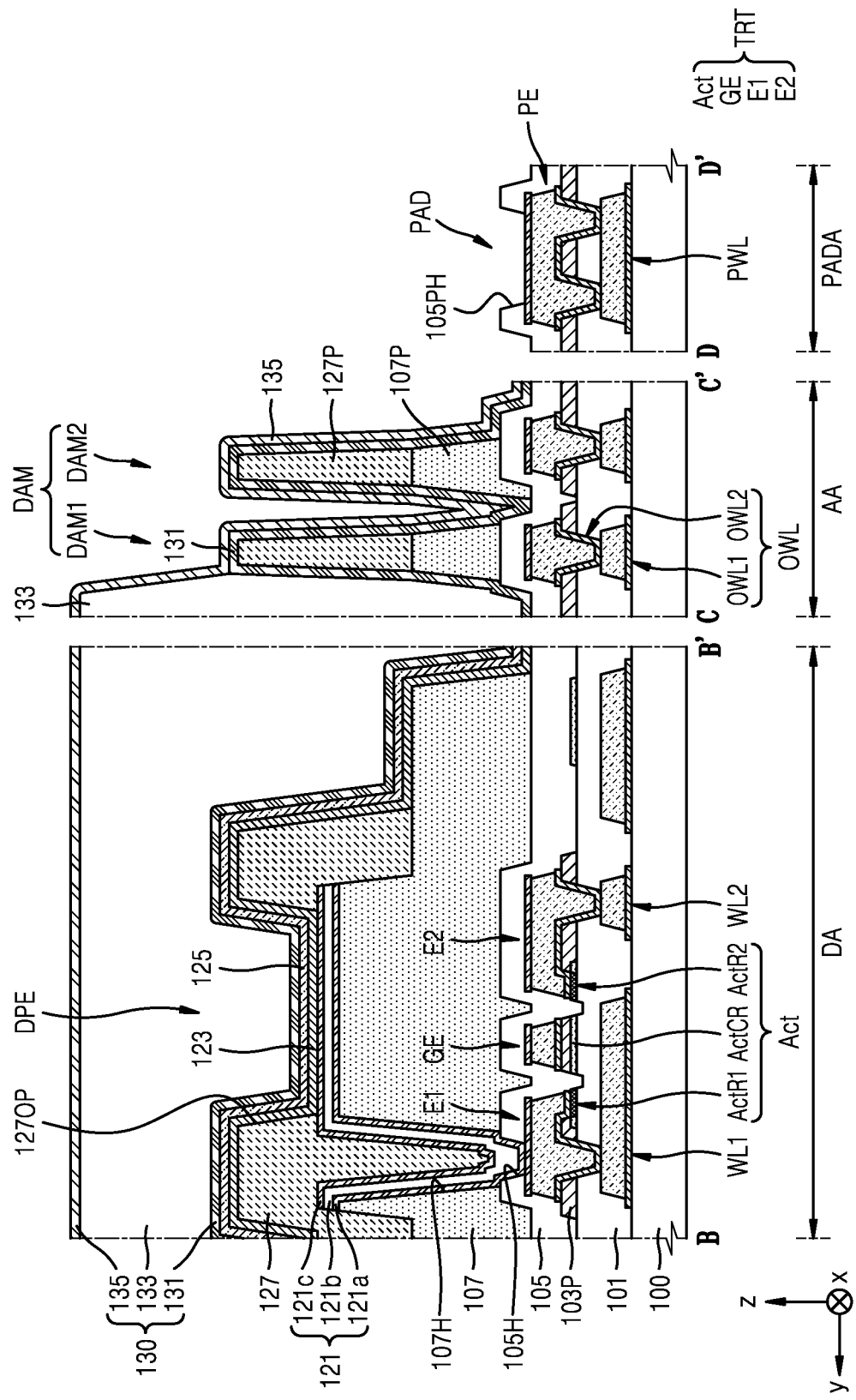
FIG. 8 is a schematic cross-sectional view of a light-emitting panel, taken along lines B-B', C-C', and D-D' of FIG. 3, according to a comparative embodiment.

FIG. 8 is a schematic cross-sectional view of the light-emitting panel 10, taken along lines B-B', C-C', and D-D' of FIG. 3, according to a comparative embodiment. In FIG. 8, the same reference numerals as those of FIG. 5A denote the same members, and thus, repeated descriptions thereof are omitted.

Referring to FIG. 8, a light-emitting panel 10 according to a comparative embodiment may include the channel region ActCR, the first region ActR1, and the second region ActR2. In a comparative embodiment, the first region ActR1 may not extend from the channel region ActCR to the first edge ActE1 of the semiconductor layer Act. In a comparative embodiment, the second inorganic insulating layer 105 may be arranged between the first region ActR1 and the channel region ActCR. In a comparative embodiment, the first inorganic insulating layer 103 may include a plurality of patterns 103P. The plurality of patterns 103P may be separated from each other, and at least a portion of the semiconductor layer Act may be exposed between the patterns 103 adjacent to each other. The separation of the plurality of patterns 103P may be designed to dope the first region ActR1 and the second region ActR2 during a subsequent process after the semiconductor layer Act is formed during the process of manufacturing the comparative light-emitting panel 10. In this case, since the semiconductor layer Act may be exposed between the plurality of patterns 103P before doping, the semiconductor layer Act may be damaged. As an example, the semiconductor layer Act may be damaged during a process of manufacturing the display apparatus 1 after the semiconductor layer Act is formed, and the electrical resistances of the first region ActR1 and the second region ActR2 may be increased.

In one or more embodiment, the first region ActR1 and the second region ActR2 may be doped while the semiconductor layer Act is formed. In addition, because the first inorganic insulating layer 103 continuously extends over the semiconductor layer Act after doping, the semiconductor layer Act except the regions overlapping the first contact hole CNT1 and the second contact hole CNT2 may not be exposed. Accordingly, the first region ActR1 and the second region ActR2 may be a doped pattern regardless of a subsequent process after the semiconductor layer Act is formed, and damage to the semiconductor layer Act may be prevented or reduced during a process of manufacturing the display apparatus 1 which is after a process of providing the semiconductor layer Act.

In addition, in a comparative embodiment, the second capacitor electrode CE2 including an oxide semiconductor may not be formed. As an example, a layer including an oxide semiconductor is covered and may not be doped. Alternatively, in the case where, to dope the layer including an oxide semiconductor layer, the layer does not overlap the plurality of patterns 103P, the layer may be damaged during a process of manufacturing the display apparatus 1 after the layer including the oxide semiconductor is formed.

One or more embodiment may include the second capacitor electrode CE2 including an oxide semiconductor pattern which is doped. The second capacitor electrode CE2 may be doped during a process of forming the semiconductor layer Act. Accordingly, the first capacitor electrode CE1 and the second capacitor electrode CE2 may together constitute the storage capacitor Cst, and the capacity of the storage capacitor Cst may increase.

Figure 9A:
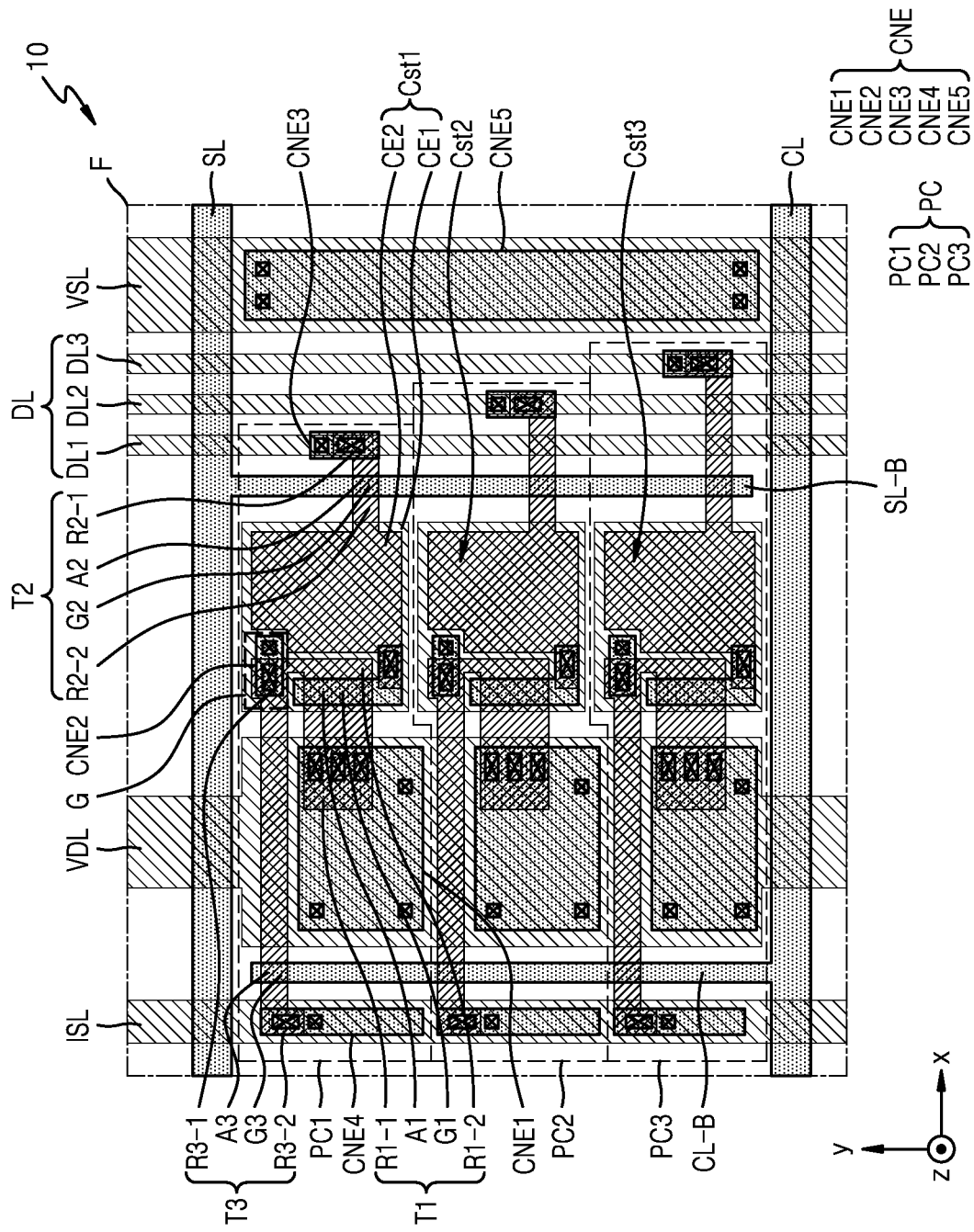
FIG. 9A is an enlarged plan view of a region F of the light-emitting panel of FIG. 3 according to an embodiment.
Figure 9B:
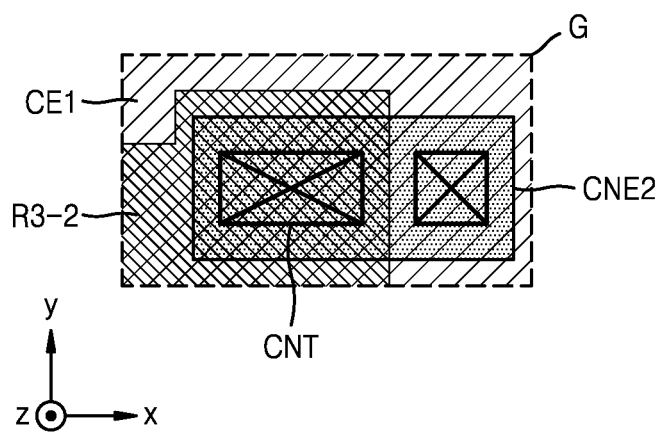
FIG. 9B is an enlarged plan view of a region G of FIG. 9A, according to an embodiment.
Figure 9C:
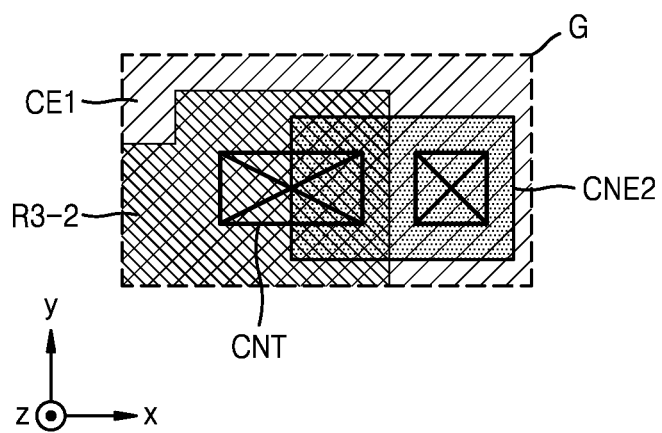
FIG. 9C is an enlarged plan view of the region G of FIG. 9A, according to a comparative embodiment.

FIG. 9A is an enlarged plan view of a region F of the light-emitting panel 10 of FIG. 3 according to an embodiment. FIG. 9B is an enlarged plan view of a region G of FIG. 9A according to an embodiment. FIG. 9C is an enlarged plan view of a region G of FIG. 9A according to a comparative embodiment.

Referring to FIG. 9A, the light-emitting panel 10 may include the pixel circuit PC, the control line CL, the data line DL, the initialization-sensing line ISL, the driving voltage line VDL, the common voltage line VSL, and a connection electrode CNE. The pixel circuit PC may include a first pixel circuit PC1, a second pixel circuit PC2, and a third pixel circuit PC3. The first pixel circuit PC1, the second pixel circuit PC2, and the third pixel circuit PC3 may be configured to respectively drive a first display element, a second display element, and a third display element. The first pixel circuit PC1 may include the first transistor T1, the second transistor T2, the third transistor T3, and a first storage capacitor Cst1. The second pixel circuit PC2 may include three transistors and a second storage capacitor Cst2. The third pixel circuit PC3 may include three transistors and a third storage capacitor Cst3. Since the second pixel circuit PC2 and the third pixel circuit PC3 are similar to the first pixel circuit PC1, the first pixel circuit PC1 is mainly described in detail.

The scan line SL and the control line CL may each extend in the x direction. In an embodiment, the scan line SL may include a first branch SL-B extending in a direction, for example, the -y direction crossing the direction in which the scan line SL extends. In an embodiment, the control line CL may include a second branch CL-B extending in a direction, for example, the y direction crossing the direction in which the control line CL extends.

The data line DL, the initialization-sensing line ISL, the driving voltage line VDL, and the common voltage line VSL may each extend in the y direction. In an embodiment, the data line DL may include a first data line DL1 together with a second data line DL2, and a third data line DL3. The first data line DL1, the second data line DL2, and the third data line DL3 may be configured to respectively supply data signals to the first pixel circuit PC1, the second pixel circuit PC2, and the third pixel circuit PC3.

The driving voltage line VDL and the data line DL may be arranged between the initialization-sensing line ISL and the common voltage line VSL. The driving voltage line VDL may be arranged between the initialization-sensing line ISL and the data line DL. The data line DL may be arranged between the driving voltage line VDL and the common voltage line VSL. The initialization-sensing line ISL and the driving voltage line VDL may be arranged on one side (e.g., the left side) of the first storage capacitor Cst1, the second storage capacitor Cst2, and the third storage capacitor Cst3, and the data line DL and the common voltage line VSL may be arranged on another side (e.g., the right side). Through this structure, a space of the light-emitting panel 10 may be efficiency used.

In a plan view, the first storage capacitor Cst1, the second storage capacitor Cst2, and the third storage capacitor Cst3 may be arranged in one direction, for example, the y direction. The first storage capacitor Cst1 may be closest to the scan line SL extending in the x direction, and the third storage capacitor Cst3 may be farthest from the scan line SL extending in the x direction. The second storage capacitor Cst2 may be arranged between the first storage capacitor Cst1 and the third storage capacitor Cst3.

The first transistor T1 may include a first channel region A1, a first region R1-1 of the first transistor T1, a second region R1-2 of the first transistor T1, and a first gate electrode G1. The first channel region A1 may be arranged between the first region R1-1 of the first transistor T1 and the second region R1-2 of the first transistor T1. The first region R1-1 of the first transistor T1 and the second region R1-2 of the first transistor T1 are regions having a less resistance than that of the first channel region A1 and may be formed by a doping process of impurities or a process of making a conductor (e.g., doped region). One of the first region R1-1 of the first transistor T1 and the second region R1-2 of the first transistor T1 may correspond to a source region, and the other may correspond to a drain region. The first gate electrode G1 may overlap the first channel region A1.

One of the first region R1-1 of the first transistor T1 and the second region R1-2 of the first transistor T1 may be connected to the driving voltage line VDL, and the other of the first region R1-1 of the first transistor T1 and the second region R1-2 of the first transistor T1 may be connected to the first storage capacitor Cst1. As an example, the first region R1-1 of the first transistor T1 may be connected to the driving voltage line VDL, and the second region R1-2 of the first transistor T1 may be connected to the first storage capacitor Cst1. The first region R1-1 of the first transistor T1 may be connected to a first connection electrode CNE1 through a contact hole of an insulating layer. In an embodiment, the first connection electrode CNE1 may be the transistor's first electrode. The first connection electrode CNE1 may be connected to the driving voltage line VDL through another contact hole of an insulating layer. The second region R1-2 of the first transistor T1 may be connected to a second connection electrode CNE2 through a contact hole of an insulating layer. In an embodiment, the second connection electrode CNE2 may be the transistor's second electrode. The second connection electrode CNE2 may be connected to the first storage capacitor Cst1 through another contact hole of an insulating layer.

The second transistor T2 may include a second channel region A2, a first region R2-1 of the second transistor T2, a second region R2-2 of the second transistor T2, and a second gate electrode G2. The second channel region A2 may be arranged between the first region R2-1 of the second transistor T2 and the second region R2-2 of the second transistor T2. The first region R2-1 of the second transistor T2 and the second region R2-2 of the second transistor T2 are regions having a less resistance than that of the second channel region A2 and may be formed by a doping process of impurities or a process of making a conductor. One of the first region R2-1 of the second transistor T2 and the second region R2-2 of the second transistor T2 may correspond to a source region, and the other may correspond to a drain region. The second gate electrode G2 may overlap the second channel region A2. The second gate electrode G2 may correspond to a portion of the scan line SL, for example, a portion of the first branch SL-B. As described above, the first branch SL-B may correspond to a gate electrode of the second transistor T2 of the first pixel circuit PC1, the second pixel circuit PC2, and the third pixel circuit PC3. The first branch SL-B may extend between the first storage capacitor Cst1 and the data line DL.

One of the first region R2-1 of the second transistor T2 and the second region R2-2 of the second transistor T2 may be connected to the first data line DL1, and the other of the first region R2-1 of the second transistor T2 and the second region R2-2 of the second transistor T may be electrically connected to the first storage capacitor Cst1. As an example, the first region R2-1 of the second transistor T2 may be connected to the first data line DL1, and the second region R2-2 of the second transistor T2 may be connected to the first storage capacitor Cst1. The first region R2-1 of the second transistor T2 may be connected to a third connection electrode CNE3 through a contact hole of an insulating layer. In an embodiment, the third connection electrode CNE3 may be the transistor's first electrode. The third connection electrode CNE3 may be connected to the first data line DL1 through another contact hole of an insulating layer. The second region R2-2 of the second transistor T2 may extend to the second capacitor electrode CE2 of the first storage capacitor Cst1. In other words, the second region R2-2 of the second transistor T2 may be provided as one body with the second capacitor electrode CE2.

The third transistor T3 may include a third channel region A3, a first region R3-1 of the third transistor T3, a second region R3-2 of the third transistor T3, and a third gate electrode G3. The third channel region A3 may be arranged between the first region R3-1 of the third transistor T3 and the second region R3-2 of the third transistor T3. The first region R3-1 of the third transistor T3 and the second region R3-2 of the third transistor T3 are regions having a less resistance than that of the third channel region A3 and may be formed by a doping process of impurities or a process of making a conductor. One of the first region R3-1 of the third transistor T3 and the second region R3-2 of the third transistor T3 may correspond to a source region, and the other may correspond to a drain region. The third gate electrode G3 may overlap the third channel region A3. The third gate electrode G3 may correspond to a portion of the control line CL, for example, a portion of the second branch CL-B. As described above, the second branch CL-B may correspond to the third gate electrode G3 of the third transistor T3 of the first pixel circuit PC1, the second pixel circuit PC2, and the third pixel circuit PC3. The second branch CL-B may extend between the driving voltage line VDL and the initialization-sensing line ISL.

One of the first region R3-1 of the third transistor T3 and the second region R3-2 of the third transistor T3 may be connected to the first storage capacitor Cst1, and the other of the first region R3-1 of the third transistor T3 and the second region R3-2 of the third transistor T3 may be connected to the initialization-sensing line ISL. As an example, the first region R3-1 of the third transistor T3 may be connected to the first storage capacitor Cst1, and the second region R3-2 of the third transistor T3 may be connected to the initialization-sensing line ISL. The first region R3-1 of the third transistor T3 may be connected to the second connection electrode CNE2 through a contact hole of an insulating layer. In an embodiment, the second connection electrode CNE2 may be the transistor's first electrode. The first region R3-1 of the third transistor T3 may extend to the second region R1-2 of the first transistor T1. In other words, the first region R3-1 of the third transistor T3 may be provided as one body with the second region R1-2 of the first transistor T1. The second region R3-2 of the third transistor T3 may be connected to a fourth connection electrode CNE4 through a contact hole of an insulating layer. In an embodiment, the fourth connection electrode CNE4 may be the transistor's second electrode. The fourth connection electrode CNE4 may be connected to the initialization-sensing line ISL through another contact hole of an insulating layer.

The first storage capacitor Cst1 may include at least two electrodes. In an embodiment, the first storage capacitor Cst1 may include the first capacitor electrode CE1 and the second capacitor electrode CE2. The first capacitor electrode CE1 may be connected to the second connection electrode CNE2. The second capacitor electrode CE2 may be provided as one body with the second region R2-2 of the second transistor T2 and connected to the first gate electrode G1 through a contact hole of the insulating layer. In another embodiment, the first storage capacitor Cst1 may further include at least one of the third capacitor electrode and the fourth capacitor electrode.

The second storage capacitor Cst2 and the third storage capacitor Cst3 may each include at least two electrodes. Since the second storage capacitor Cst2 and the third storage capacitor Cst3 are similar to the first storage capacitor Cst1, detailed description thereof is omitted.

In an embodiment, the common voltage line VSL may be connected to a fifth connection electrode CNE5 through a contact hole of the insulating layer. The fifth connection electrode CNE5 may extend in an extension direction, for example, the y direction of the common voltage line VSL. Accordingly, the resistance of the common voltage line VSL may be reduced. In an embodiment, the initialization-sensing line ISL may be connected to the fourth connection electrode CNE4 through a contact hole of the insulating layer. The fourth connection electrode CNE4 may extend in an extension direction, for example, the y direction of the initialization-sensing line ISL. Accordingly, the resistance of the initialization-sensing line ISL may be reduced.

The data line DL, the initialization-sensing line ISL, the driving voltage line VDL, the common voltage line VSL, and the first capacitor electrode CE1 may be arranged on the same layer and may include the same material. The data line DL, the initialization-sensing line ISL, the driving voltage line VDL, the common voltage line VSL, and the first capacitor electrode CE1 may be formed during the same process.

A first insulating layer may be arranged on the data line DL, the initialization-sensing line ISL, the driving voltage line VDL, the common voltage line VSL, and the first capacitor electrode CE1. The semiconductor layer Act and the second capacitor electrode CE2 may be arranged on the first insulating layer. The semiconductor layer Act may include the first region R1-1 of the first transistor T1, the first channel region A1, the second region R1-2 of the first transistor T1, the first region R2-1 of the second transistor T2, the second channel region A2, the second region R2-2 of the second transistor T2, the first region R3-1 of the third transistor T3, the third channel region A3, the second region R3-2 of the third transistor T3. The semiconductor layer Act may include these regions extending. The semiconductor layer Act and the second capacitor electrode CE2 may be arranged on the same layer and may include the same material. The semiconductor layer and the second capacitor electrode CE2 may be formed during the same process.

A second insulating layer may be arranged on the semiconductor layer Act and the second capacitor electrode CE2. The scan line SL, the control line CL, and the connection electrode CNE may be arranged on the second insulating layer. In an embodiment, the connection electrode CNE may include the first connection electrode CN E1, the second connection electrode CNE2, the third connection electrode CNE3, the fourth connection electrode CNE4, and the fifth connection electrode CNE5.

Referring to FIG. 9B, the contact hole CNT may be entirely overlapped by the second connection electrode CNE2 in a plan view. In other words, all of the outer periphery of the contact hole CNT may overlap the second connection electrode CNE2.

In the case where the second region R3-2 of the third transistor T3 is not doped in advance, an entirety of the contact hole CNT not overlapped by the second connection electrode CNE2 in a plan view as shown in FIG. 9C, and impurities may be added through the portion of the contact hole CNT that does not overlap the second connection electrode CNE2 in a plan view. However, in this case, during a patterning process of forming the second connection electrode CNE2, the second region R3-2 of the third transistor T3 that overlaps a portion of the contact hole CNT that does not overlap the second connection electrode CNE2 may be damaged or removed. In addition, the resistance of the second region R3-2 of the third transistor T3 may be increased. In addition, since the second connection electrode CNE2 is connected to the second region R3-2 of the third transistor T3 through at least a portion of the contact hole CNT, stability may not be achieved.

In contrast, in one or more present embodiment, impurities may be added while the second region R3-2 of the third transistor T3 is formed. Accordingly, the contact hole CNT does not need to be at least partially exposed during a subsequent process, and the second region R3-2 of the third transistor T3 may be prevented or reduced from being damaged or removed. Accordingly, the second region R3-2 of the third transistor T3 may maintain a low resistance.

As described above, the display apparatus 1 according to an embodiment may include the semiconductor layer Act, wherein the semiconductor layer Act includes an oxide semiconductor and includes the semiconductor channel region and the semiconductor first region extending from the semiconductor channel region to the semiconductor first edge and having a lower resistance than that of the semiconductor channel region. The first inorganic insulating layer 103 may cover the semiconductor layer Act and include the first contact hole CNT1 overlapping the semiconductor first region. In addition, the transistor first electrode and the transistor gate electrode may be arranged between the first inorganic insulating layer 103 and the second inorganic insulating layer 105, where the transistor first electrode overlaps the semiconductor first region and is electrically connected to the semiconductor first region through the first contact hole CNT1, and the transistor gate electrode overlaps the semiconductor channel region.

Accordingly, the display apparatus 1 according to an embodiment may have a simple stacked structure, and simultaneously, have a high reliability.

In the method of manufacturing (or providing) the display apparatus 1 according to an embodiment, the semiconductor layer Act is formed including an oxide semiconductor and includes the semiconductor channel region and the semiconductor first region having a lower resistance than that of the semiconductor channel region. The first inorganic insulating layer 103 covering the semiconductor first region and the semiconductor channel region may be formed. Accordingly, since the semiconductor first region is doped and then covered by the first inorganic insulating layer 103, reliability thereof may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate;
   a transistor on the substrate, including:
      a semiconductor layer including an oxide semiconductor, a channel region and a first region which extends from the channel region to define a first edge of the semiconductor layer;
      within the semiconductor layer, an electrical resistance of the first region lower than an electrical resistance of the channel region;
      a first inorganic insulating layer covering the semiconductor layer and defining a first contact hole which overlaps the first region;
      a first electrode on the first inorganic insulating layer and electrically connected to the first region of the semiconductor at the first contact hole in the first inorganic insulating layer; and
      a gate electrode on the first inorganic insulating layer and overlapping the channel region;
   a second inorganic insulating layer covering the first electrode and the gate electrode of the transistor;
   a capacitor electrically connected to the transistor, the capacitor comprising a first capacitor electrode, a second capacitor electrode and a third capacitor electrode which overlap each other, wherein
      the second capacitor electrode comprises a same material as the first region of the semiconductor layer,
      the first capacitor electrode is below the second capacitor electrode, and
      the third capacitor electrode is above the second capacitor electrode and is electrically connected to the first capacitor electrode, and
   a display element which is on the second inorganic insulating layer and connected to the transistor.

2. The apparatus of claim 1, wherein the first electrode of the transistor overlaps an entirety of the first contact hole of the first inorganic insulating layer.

3. The apparatus of claim 1, wherein the first electrode and the gate electrode of the transistor are both between the first inorganic insulating layer and the second inorganic insulating layer and include a same material as each other.

4. The apparatus of claim 1, wherein
   the transistor further includes a second electrode between the first inorganic insulating layer and the second inorganic insulating layer,
   the semiconductor layer further includes a second region extending from the channel region to define a second edge of the semiconductor layer which is opposite to the first edge,
   within the semiconductor layer, an electrical resistance of the second region is lower than the electrical resistance of the channel region, and overlapping the second electrode,
   the first inorganic insulating layer further defines a second contact hole which overlaps the second region of the semiconductor layer,
   the second electrode of the transistor is electrically connected to the second region of the semiconductor at the second contact hole in the first inorganic insulating layer,
   the second inorganic insulating layer includes a lower hole exposing the first electrode or the second electrode to outside the second inorganic insulating layer, and
   at the lower hole, the first electrode or the second electrode of the transistor is electrically connected to the display element.

5. The apparatus of claim 4, wherein the first inorganic insulating layer continuously extends from the first contact hole to the second contact hole and overlaps each of the first region, the channel region and the second region of the semiconductor layer.

6. The apparatus of claim 1, further comprising:
   a buffer layer between the substrate and the semiconductor layer and defining a hole of the buffer layer; and
   a wiring between the substrate and the buffer layer,
   wherein
      the first inorganic insulating layer further defines a hole corresponding to the hole of the buffer layer, and
      the wiring is electrically connected to the first electrode of the transistor at the hole of the buffer layer and the hole of the first inorganic insulating layer.

7. The apparatus of claim 6, wherein
   the first capacitor electrode is between the substrate and the buffer layer;
   the second capacitor electrode is between the buffer layer and the first inorganic insulating layer; and
   an electrical resistance of the second capacitor electrode is lower than the electrical resistance of the channel region of the transistor.

8. The apparatus of claim 7, wherein the third capacitor electrode is between the first inorganic insulating layer and the second inorganic insulating layer.

9. The apparatus of claim 7, wherein
   the capacitor further includes a fourth capacitor electrode on the second inorganic insulating layer and overlapping the second capacitor electrode,
   the display element includes a pixel electrode, an emission layer and an opposite electrode, and
   the pixel electrode of the display element and the fourth capacitor electrode of the capacitor are respective patterns of a same material layer on the substrate.

10. The apparatus of claim 1, wherein the display element emits light,
    further comprising a color panel which is on the display element and changes a wavelength of the light which is emitted from the display element.

11. A method for providing an electronic apparatus, the method comprising:

providing a semiconductor layer of a transistor, on a substrate, the semiconductor layer including an oxide semiconductor, a channel region having an electrical resistance, and a first region having an electrical resistance which is lower than the electrical resistance of the channel region;

after the providing of the first region of the semiconductor layer having the electrical resistance which is lower than the electrical resistance of the channel region:

providing a first inorganic insulating layer covering the first region and the channel region of the semiconductor layer; and providing a first contact hole in the first inorganic insulating layer which overlaps the first region of the transistor;

providing an electrode layer of the transistor, the electrode layer including a first electrode which overlaps the first region and is electrically connected to the first region at the first contact hole, and a gate electrode which overlaps the channel region; and providing a second inorganic insulating layer covering the first electrode and the gate electrode of the transistor.

12. The method of claim 11, wherein the providing of the semiconductor layer includes:

providing a first layer including the oxide semiconductor;

providing a photoresist on the first layer, the photoresist including:
- a first photoresist region which corresponds to the first region of the semiconductor layer and has a first thickness, and
- a channel photoresist region which corresponds to the channel region of the semiconductor layer and has a second thickness greater than the first thickness;

providing etching of the first layer having the photoresist thereon, to provide portions of the first layer as the first region and the channel region of the semiconductor layer, respectively; and providing stripping of the photoresist from the first layer which is etched.

13. The method of claim 12, wherein the providing of the photoresist includes etching the photoresist to expose the first region of the semiconductor layer to outside the photoresist, and the providing of the semiconductor layer includes doping of the first region which is exposed to outside the photoresist.

14. The method of claim 13, wherein the providing of the etching of the first layer defines the first region of the semiconductor layer which extends from the channel region and defines a first edge of the semiconductor layer.

15. The method of claim 11, further comprising providing a first capacitor electrode of a capacitor, and a buffer layer, between the substrate and the semiconductor layer, wherein the providing of the semiconductor layer includes providing a second capacitor electrode of the capacitor which includes the oxide semiconductor, overlaps the first capacitor electrode and has an electrical resistance lower than the electrical resistance of the channel region, and the first inorganic insulating layer is further provided covering the second capacitor electrode after the providing of the second capacitor electrode having the electrical resistance lower than the electrical resistance of the channel region.

16. The method of claim 15, wherein the providing of the semiconductor layer further includes:

providing a first layer including the oxide semiconductor;

providing a photoresist on the first layer, the photoresist including a capacitor photoresist which corresponds to the second capacitor electrode;

providing etching of the first layer having the capacitor photoresist thereon, to provide a portion of the first layer as the second capacitor electrode of the capacitor;

providing etching of the capacitor photoresist to expose the portion of the first layer as the second capacitor electrode, to outside the photoresist; and providing doping of the portion of the first layer as the second capacitor electrode, to provide the second capacitor electrode of the capacitor which has the electrical resistance lower than the electrical resistance of the channel region.

17. The method of claim 11, wherein the semiconductor layer further includes a second region having an electrical resistance which is lower than the electrical resistance of the channel region;

the providing of the etching of the first layer defines the second region of the semiconductor layer which extends from the channel region and defines a second edge of the semiconductor layer;

the providing of the first contact hole includes further providing a second contact hole in the first inorganic insulating layer which overlaps the second region of the transistor, and the first inorganic insulating layer continuously extends from the first contact hole to the second contact hole, and overlaps the first region, the channel region and the second region of the semiconductor layer.

18. The method of claim 11, further comprising:

providing an organic insulating layer on the second inorganic insulating layer;

providing an organic insulating layer hole in the organic insulating layer, by exposing and developing a portion of the organic insulating layer which corresponds to the semiconductor layer of the transistor; and providing a lower hole in the second inorganic insulating layer which overlaps the organic insulating layer hole of the organic insulating layer, by etching the second inorganic insulating layer.

19. The method of claim 18, wherein the exposing and developing of the portion of the organic insulating layer and the etching of the second inorganic insulating layer comprises using a same mask.

20. The method of claim 18, further comprising:

providing a pixel electrode of a display element which overlaps the organic insulating layer hole of the organic insulating layer; and providing a pixel-defining layer which covers edges of the pixel electrode and defines a pixel opening which overlaps the pixel electrode.

* * * * *